(12) United States Patent
Savarese et al.

(10) Patent No.: US 7,766,766 B2
(45) Date of Patent: Aug. 3, 2010

(54) METHODS AND APPARATUSES RELATING TO FINDABLE BALLS

(75) Inventors: Chris Savarese, Danville, CA (US);
Noel H. C. Marshall, Gerringong (AU);
Lauro C. Cadomiga, Piedmont, SC (US); Susan McGill, Redwood City, CA (US); Harold W. Ng, Concord, CA (US)

(73) Assignee: Radar Corporation, San Ramon, CA (US)

( * ) Notice: Subject to any disclaimer, the term of this patent is extended or adjusted under 35 U.S.C. 154(b) by 841 days.

(21) Appl. No.: 11/248,766

(22) Filed: Oct. 11, 2005

(65) Prior Publication Data
US 2006/0122007 A1 Jun. 8, 2006

Related U.S. Application Data

(63) Continuation-in-part of application No. 10/672,365, filed on Sep. 26, 2003.

(51) Int. Cl.
*A63B 37/00* (2006.01)
(52) U.S. Cl. .................. 473/351; 473/353; 473/371
(58) Field of Classification Search ............... 473/353, 473/351, 371
See application file for complete search history.

(56) References Cited

U.S. PATENT DOCUMENTS

| | | | |
|---|---|---|---|
| 1,620,290 A | 3/1927 | Rubin | |
| 3,782,730 A * | 1/1974 | Horchler ................. | 473/353 |
| 4,331,957 A | 5/1982 | Enander et al. | |
| 4,528,566 A | 7/1985 | Tyler | |
| 4,595,200 A | 6/1986 | Shishido | |
| 4,698,781 A | 10/1987 | Cockerell, Jr. | |
| 4,742,357 A | 5/1988 | Rackley | |
| 4,955,613 A | 9/1990 | Gendreau et al. | |
| 5,112,055 A | 5/1992 | Barnhill | |
| 5,132,622 A | 7/1992 | Valentino | |
| 5,298,904 A | 3/1994 | Olich | |
| 5,423,549 A | 6/1995 | Englmeier | |

(Continued)

FOREIGN PATENT DOCUMENTS

DE      87 09 503.3 U1     1/1988

(Continued)

OTHER PUBLICATIONS

PCT International Preliminary Report on Patentability for PCT International Appln No. US2004/027598, mailed Apr. 6, 2006 (8 pages).

(Continued)

*Primary Examiner*—Raeann Trimiew
(74) *Attorney, Agent, or Firm*—Blakely, Sokoloff, Taylor & Zafman LLP

(57) ABSTRACT

Golf balls and methods and systems for manufacturing golf balls. In one exemplary embodiment, a portion of a golf ball comprises a core material having a void, a semiconductor component disposed at least partially in the void, and a filler material in the void and surrounding the semiconductor component, the filler material being placed in the void in a liquid state and occupying a first volume in the liquid state and the filler material transforming into a solid state which occupies substantially the first volume. Methods for manufacturing golf balls and fixtures and apparatuses for manufacturing golf balls are also described.

13 Claims, 33 Drawing Sheets

U.S. PATENT DOCUMENTS

| | | | |
|---|---|---|---|
| 5,447,314 | A | 9/1995 | Yamazaki et al. |
| 5,487,542 | A | 1/1996 | Foley |
| 5,508,350 | A | 4/1996 | Cadorniga et al. |
| 5,538,794 | A | 7/1996 | Cadorniga et al. |
| 5,564,698 | A | 10/1996 | Honey et al. |
| 5,582,550 | A | 12/1996 | Foley |
| 5,586,950 | A | 12/1996 | Endo |
| 5,626,531 | A * | 5/1997 | Little .................. 473/353 |
| 5,662,534 | A | 9/1997 | Kroll et al. |
| 5,743,815 | A | 4/1998 | Helderman |
| 5,820,484 | A | 10/1998 | Terry |
| 5,910,057 | A | 6/1999 | Quimby et al. |
| 6,107,920 | A | 8/2000 | Eberhardt et al. |
| 6,113,504 | A | 9/2000 | Kuesters |
| 6,246,327 | B1 | 6/2001 | Eberhardt |
| 6,276,266 | B1 | 8/2001 | Dietz et al. |
| 6,284,840 | B1 | 9/2001 | Rajagopalan et al. |
| 6,357,664 | B1 | 3/2002 | Zercher |
| 6,390,935 | B1 | 5/2002 | Sugimoto |
| 6,620,057 | B1 * | 9/2003 | Pirritano et al. ............. 473/353 |
| 6,634,959 | B2 | 10/2003 | Kuesters |
| 6,705,942 | B1 | 3/2004 | Crook et al. |
| 6,762,244 | B2 | 7/2004 | Rajagopalan et al. |
| 6,840,167 | B2 | 1/2005 | Clark et al. |
| 7,059,974 | B1 | 6/2006 | Golliffe et al. |
| 2001/0006489 | A1 | 7/2001 | Gaffney |
| 2001/0045904 | A1 | 11/2001 | Silzer, Jr. |
| 2002/0004723 | A1 | 1/2002 | Meifu et al. |
| 2002/0082120 | A1 | 6/2002 | McLaughlin |
| 2002/0091017 | A1 * | 7/2002 | Kuesters .................. 473/353 |
| 2002/0098913 | A1 | 7/2002 | Goldman |
| 2002/0177490 | A1 | 11/2002 | Yong et al. |
| 2003/0008727 | A1 | 1/2003 | Miller |
| 2003/0017884 | A1 | 1/2003 | Masters et al. |
| 2003/0106634 | A1 | 6/2003 | Adkins et al. |
| 2003/0191547 | A1 | 10/2003 | Morse |
| 2004/0014536 | A1 | 1/2004 | Kuesters |
| 2004/0058749 | A1 | 3/2004 | Pirritano et al. |
| 2004/0142766 | A1 | 7/2004 | Savarese et al. |
| 2005/0070375 | A1 | 3/2005 | Savarese et al. |
| 2005/0070376 | A1 | 3/2005 | Savarese et al. |

FOREIGN PATENT DOCUMENTS

| | | |
|---|---|---|
| DE | 39 26 684 A1 | 2/1991 |
| DE | 100 57 670 C1 | 3/2002 |
| EP | 1 035 418 A1 | 9/2000 |
| FR | 2667 510 A | 4/1992 |
| GB | 2395 438 A | 5/2004 |
| JP | 2003085510 A | 3/2003 |
| JP | 2003158414 A | 5/2003 |
| WO | WO 01/02060 A1 | 1/2001 |
| WO | WO 01/02061 A1 | 1/2001 |
| WO | WO 03/068874 A1 | 8/2003 |

OTHER PUBLICATIONS

PCT International Preliminary Report on Patentability for PCT International Appln No. US2004/027597, mailed Apr. 6, 2006 (8 pages).
Radar Golf, Inc. video clip titled "Radar Golf Movie MVI-1902" on a CD (Jan. 20, 2005).
PCT Search Report for PCT International Appln No. US2004/001126, mailed Mar. 31, 2005 (10 pages).
PCT Written Opinion for PCT International Appln No. US2004/001126, mailed Mar. 31, 2005 (11 pages).
PCT Search Report for PCT International Appln No. US2004/027598, mailed Dec. 7, 2004 (7 pages).
PCT Written Opinion for PCT International Appln No. US2004/027598, mailed Dec. 7, 2004 (6 pages).
PCT Search Report for PCT International Appln No. US2004/027597, mailed Nov. 19, 2004 (7 pages).
PCT Written Opinion for PCT International Appln No. US2004/027597, mailed Nov. 19, 2004 (6 pages).
Invitation to pay additional fees for PCT International Appln No. US04/001126, mailed Aug. 2, 2004 (5 pages).
PCT International Preliminary Report on Patentability for PCT International Appln No. US2004/001126, mailed Aug. 4, 2005 (14 pages).
PCT International Preliminary Report on Patentability for PCT International Appln No. US2006/039416, mailed Aug. 24, 2008 (8 pages).

* cited by examiner

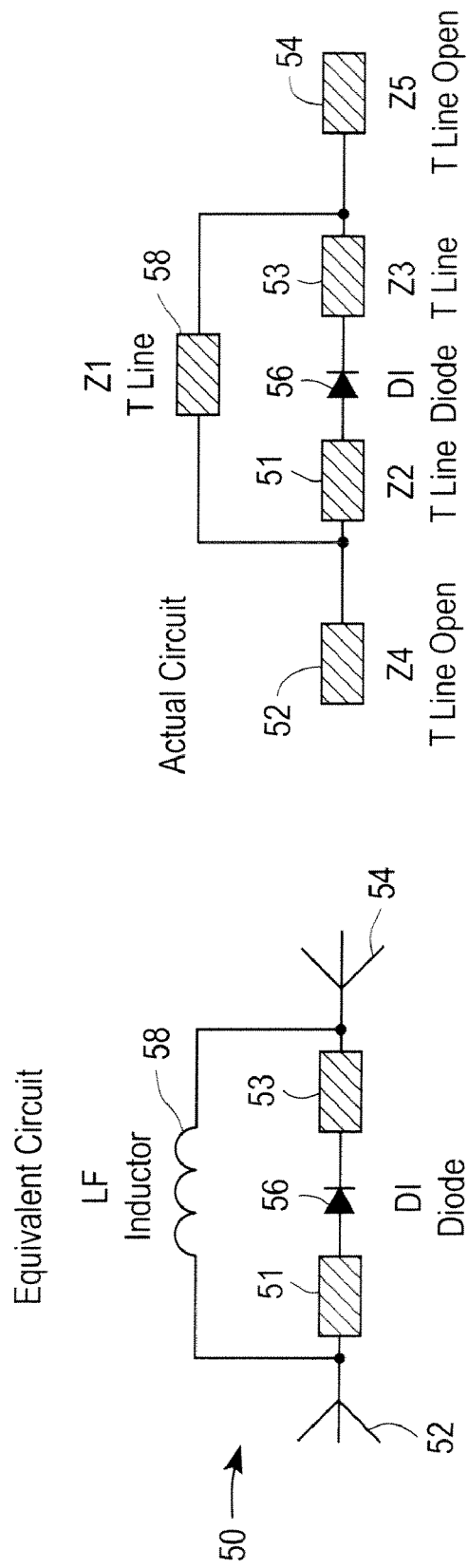

Antenna On Core
(Not To Scale)
Shown On A 3-piece Ball

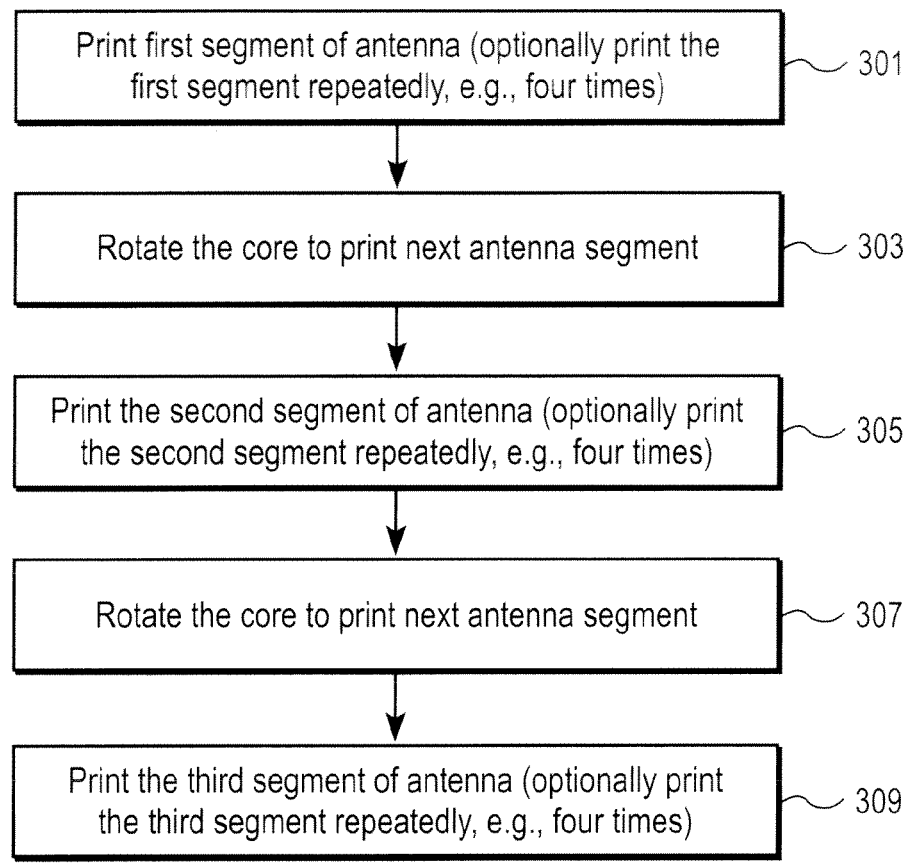
FIG. 11
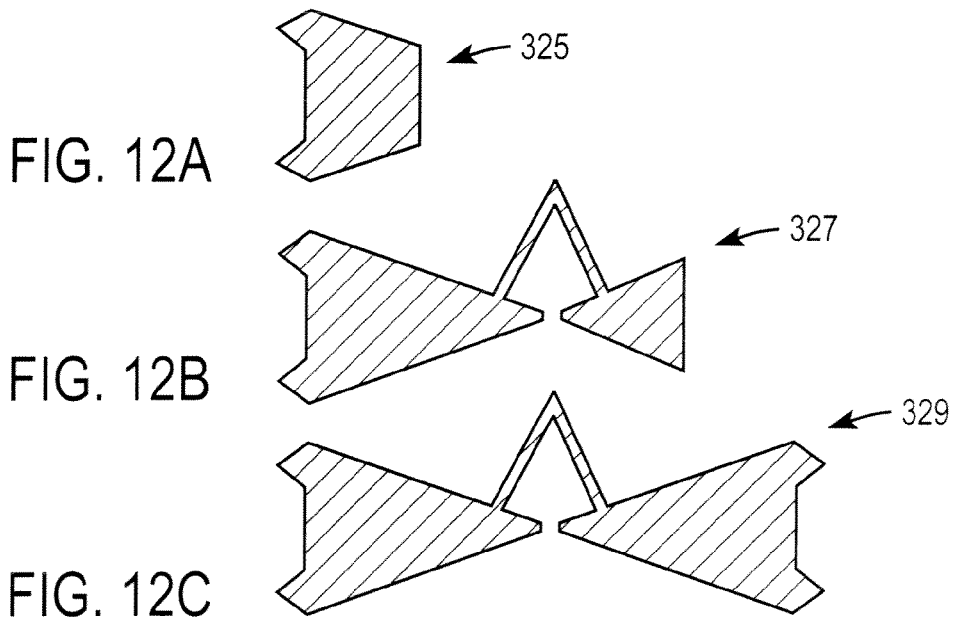
FIG. 12A
FIG. 12B
FIG. 12C

ALL DIMENSIONS TYPICAL

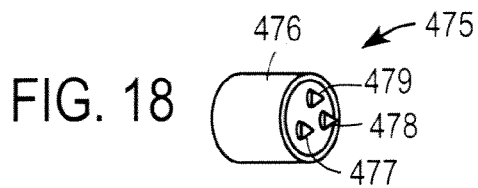
FIG. 18
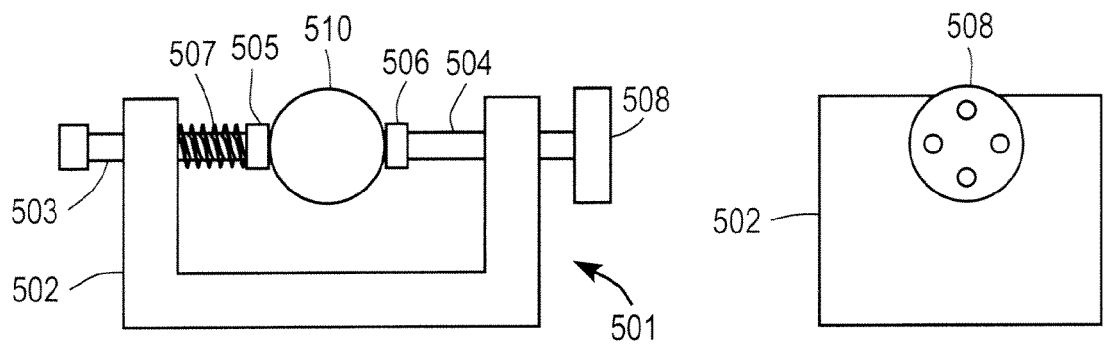
FIG. 19A
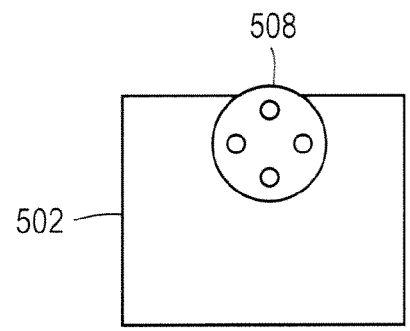
FIG. 19B
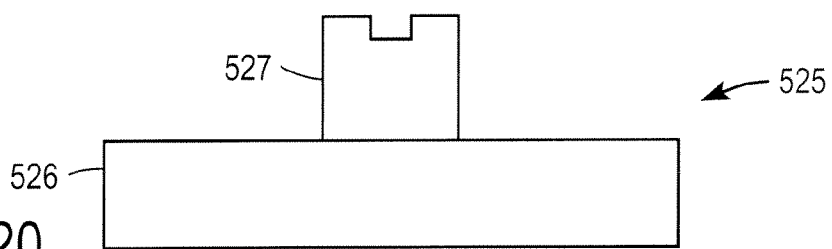
FIG. 20
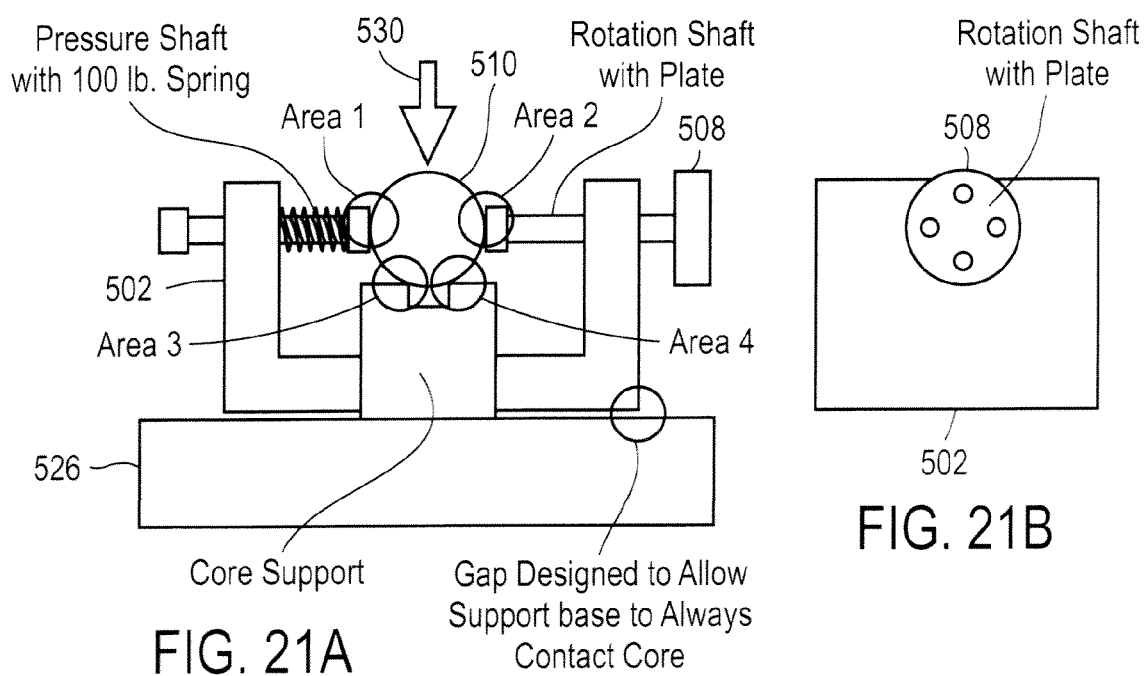
FIG. 21A
FIG. 21B

METHODS AND APPARATUSES RELATING TO FINDABLE BALLS

This application is a continuation-in-part of U.S. patent application Ser. No. 10/672,365, filed Sep. 26, 2003, and entitled "Apparatuses and Methods Relating to Findable Balls."

FIELD OF THE INVENTION

The invention is related to sports, such as golf, and more particularly to golf balls, and methods for making golf balls and systems for use with golf balls.

BACKGROUND OF THE INVENTION

Golf balls are often lost when people play golf. The loss of the ball slows down the game as players search for a lost ball, and lost balls make the game more expensive to play because of the cost of new balls. Furthermore, according to the rules of the U.S. Golf Association, a player is penalized for strokes in a round or game of golf if his/her golf ball is lost.

There have been attempts in the past to make findable golf balls in order to avoid some of the problems caused by lost balls. One such attempt is described in German Patent No. G 87 09 503.3 (Helmut Mayer, 1988). In this German patent, a two-piece golf ball is fitted with foil reflectors which are glued to the outer layer of the core. A shell surrounds the foil reflectors and the core. Each of the reflectors consists of a two-part foil antenna with a diode connected on the inner ends. The diode causes a reflected signal to be double the frequency of a received signal. A 5-watt transmitter, which is used to beam a signal toward the reflectors, is used to find the ball. The ball is found when a reflected signal is generated by the foil antenna and diode and reflected back toward a receiver. It has been discovered that this all foil antenna does not provide a durable antenna and that the ball will not be findable (e.g. findable for a distance of greater than 20 feet) after only a few hits on the ball.

Another attempt in the art to make a findable golf ball is described in PCT Patent Application No. WO 0102060 A1, which describes a golf ball for use in a driving range. This golf ball includes an active radiofrequency identification device (RFID) which identifies a particular ball. The RFID includes an active (e.g. contains transistors) ASIC chip which is energized from a received radio signal. The RFID device is mounted in the sealed capsule which is placed within the core of the ball. The RFID device is designed to be used only at short range (e.g. less than about 10 feet). The use of a sealed capsule to hold the RFID within the ball increases the expense of making this ball and is believed to degrade the performance of the ball.

Other examples of attempts in the prior art to make findable golf balls include U.S. Pat. Nos.: 5,626,531; 5,423,549; 5,662,534; and 5,820,484.

SUMMARY OF THE DESCRIPTION

Apparatuses, golf balls, portions of golf balls, and methods and systems relating to findable golf balls are described herein. In one exemplary embodiment, a portion of a golf ball includes a core material having a void, a semiconductor component (e.g., such as a diode or RFID IC or other circuitry) disposed at least partially in the void, and a filler material in the void and surrounding the semiconductor component. The semiconductor component may be surrounded on its side surfaces and on its bottom surface. The filler fills any gaps between the semiconductor component and the sides of the void (and may also be used to fill imperfections in the surface of the core material adjacent to the void). The filler, by filling gaps, provides a relatively smooth and even surface to support an antenna or circuitry. Over a short distance on the spherical surface, the filler and the edge of the void and the edge of the semiconductor component form a substantially planar surface which can support an antenna or circuitry.

The filler, in at least certain embodiments, is placed in the void in a liquid state and occupies a first volume in the liquid state, and the filler material transforms into a solid state which occupies substantially the first volume. The transformation of the filler material typically occurs with virtually no shrinking and no evaporation of a solvent; rather than evaporation, the transformation involves a chemical reaction rather than a physical process. In certain embodiments, a difference in volume between the liquid state and the solid state is less than about 0.2% of the liquid state. This curing without any appreciable shrinking tends to prevent gas or vacuum pockets from developing in the cured filler material. The semiconductor component is typically coupled to an antenna or circuitry after the filler material has cured and become a solid (e.g. a gel-like consistency); in alternative embodiments, the semiconductor component may be coupled to an antenna or circuitry before the filler is cured.

In another aspect of this disclosure, an exemplary method includes forming, on a portion of a golf ball, a first segment of a first antenna, the first segment having a first pattern and forming, on the portion of the golf ball, a second segment of the first antenna after forming the first segment, wherein the second segment has a second pattern. The portion is typically a core of the golf ball, and the first pattern is different than the second pattern, and the forming may involve a pad printing operation. The first segment may be printed multiple times, and the second segment may be printed multiple times. Additional segments may be applied (e.g. printing a third or fourth segment).

In another aspect of this disclosure, an exemplary apparatus for manufacturing a portion of a golf ball includes a dispenser to hold antenna material for at least one of a first segment of an antenna and a second segment of the antenna and a fixture coupled to the dispenser, the fixture being designed to hold a portion of a golf ball to receive separately the first segment and the second segment. The dispenser may include a first dispenser to hold antenna material in a first pattern and a second dispenser to hold antenna material in a second pattern. The apparatus may also include a first transfer medium coupled to a first station, the first transfer medium designed to transfer antenna material from the first dispenser to the portion of the golf ball, and may also include a second transfer medium coupled to a second station, the second transfer medium designed to transfer antenna material from the second dispenser to the portion of the golf ball.

In another aspect of this disclosure, an exemplary method of fabricating a golf ball includes depositing a filler material into a void on a surface of a core of a golf ball, depositing a semiconductor component (e.g. a diode or a RFID IC) at least partially into the void, and removing any excess filler material from the surface of the core. Alternatively, a precise amount of filler material may be measured and dispensed into the void so that no excess needs to be removed. The removing may include wiping the surface with a material (e.g. a sponge) and a solvent (e.g. water) of the filler material. The solvent may be selected such that it does not significantly dissolve any antenna material on the surface of the core. The filler material may be selected such that it may be cured at substantially room temperature.

In another aspect of this disclosure, an exemplary method of fabricating a golf ball includes depositing a filler material into a void on a surface of a core of a golf ball, depositing a semiconductor component at least partially into the void, and curing the filler material at a temperature of less than about 90° F. for about 120 minutes. This exemplary method may further include depositing the filler material into an additional void on the surface of the core, depositing an additional semiconductor component at least partially into the additional void, and removing any excess filler material from the surface of the core, wherein the void and the additional void form an angle of about 180° (for example, the void and the additional void are disposed at opposing poles of the core).

In another aspect of this disclosure, an exemplary method of fabricating a golf ball includes applying an antenna to a core of a golf ball, coupling a semiconductor component (e.g. a diode or an RFID IC) to the antenna, testing the antenna and the semiconductor component for a radio frequency (RF) response and applying a shell material to enclose the core and the semiconductor component and the antenna within the shell material if the RF response is acceptable. In this method, the operation of applying the shell material may be avoided if the test shows that the RF response is not acceptable. Another test for RF response may be performed after the shell material has been applied.

In another aspect of this disclosure, an exemplary method of fabricating a golf ball includes placing a portion (e.g. a core) into a fixture, aligning a feature on the core relative to a registration position on the fixture, the feature having a predetermined position relative to a void on the core. In one implementation of this method, the feature is the void.

In another aspect of this disclosure, an exemplary mold for fabricating a golf ball includes a body which is used to form at least a portion (e.g. a core) of a golf ball, the body having a surface which has a shape and size to form the portion in a desired shape and size, the body having at least one opening on the surface and the body defining a cavity, and a protrusion which retractably extends beyond the opening into the cavity to form a void in a ball material, the void being designed to receive at least a portion of an electrical component (e.g. a diode or an RFID IC) of a tag.

In another aspect of this disclosure, an exemplary mold for fabricating a golf ball includes a body which is used to form at least a portion of a golf ball, the body having a surface which has a shape and size to form the portion in a desired shape and size, and a feature on the surface. The feature is designed to make a void in a ball material, and the void is designed to receive at least a portion of an electrical component (e.g. a diode or an RFID IC) of a tag. The feature has a wall which has an angle, relative to the body, to allow a formed portion of the golf ball to be removed. The wall of the feature and another wall of the feature are typically not parallel, and the wall and the another wall are coupled to a base of the feature.

In another aspect of this disclosure, an exemplary method for locating a golf ball includes placing at least one of a golf ball with an RF circuit or a cellular telephone or a car key in a container which includes an RF shielding layer and activating an RF transmitter to locate a golf ball. The container may be a pouch or bag which is capable of being coupled to a bag for golf clubs. The RF shielding layer typically includes an RF shielding material which defines a void (to hold golf balls with an RF circuit or car keys, etc.), and the RF shielding material significantly attenuates (e.g. attenuates by at least 70% to 90% or more) RF emissions from the RF transmitter.

In another aspect of this disclosure, an exemplary fixture for holding a portion of a golf ball during fabrication of the golf ball includes a horizontal support which restricts horizontal movement of the portion and a vertical support which restricts vertical movement of the portion, the horizontal support being capable of vertical movement above the vertical support. The horizontal support is coupled to the portion and the vertical support is coupled to the portion. The vertical support counteracts a force from a transfer medium which applies, in a vertical direction, an antenna material onto the portion. The horizontal support may comprise a surface with pins which engage the portion and a biasing spring which secures the portion in the horizontal support.

In another exemplary embodiment, a golf ball includes a ball material, a first tag which is attached to the ball material, and a second tag which is attached to the ball material. The first tag has a first antenna which is coupled to a first diode, wherein the first antenna is patterned to include at least a first radial transmission line. The second tag has a second antenna which is coupled to a second diode, wherein the second antenna is patterned to include at least a second radial transmission line, which is arranged substantially orthogonally relative to the first radial transmission line. In another exemplary embodiment of a golf ball described herein, a golf ball includes a ball material and a tag having a diode coupled to an antenna, wherein the antenna has two radial transmission lines with a natural resonant frequency between an excitation frequency from a handheld transmitting/receiving device and a second harmonic of the excitation frequency.

Various embodiments described herein will provide a golf ball which is detectable with a handheld transmitting/receiving device over a range of at least 20 feet (separating the tag and the handheld transmitting/receiving device). Certain of these embodiments provide golf balls which have high durability, such that most such balls can normally survive at least 20 cannon hits using standard testing methodology used by the golf industry. Further, many of the golf balls provided by the various embodiments may substantially comply with golf ball specifications of the U.S. Golf Association or the golf ball specifications of the Royal and Ancient Golf Club of St. Andrews. Further, certain embodiments of the golf balls described herein may be detectable with a handheld transmitting/receiving device which is capable of detecting a tag over a range of at least 20 feet and which complies with regulations of the Federal Communications Commission. For example, in certain of these embodiments, golf balls may be detectable at a range of at least 20 feet, while the transmitter transmits less than or equal to about 1 watt maximum peak power or about 4 watts isotropic radiated power.

In another embodiment, a golf ball includes a ball material and a first tag, which includes a first antenna coupled to a first electrical component, and a second tag, which includes a second antenna coupled to a second electrical component. The main axis of the first antenna is substantially orthogonal to the main axis of the second antenna. The first antenna may be a folded dipole antenna, and the second antenna may also be a folded dipole antenna.

Other embodiments of golf balls and methods of making golf balls and apparatuses, such as fixtures, for making golf balls are described. Other features and embodiments of various aspects of the various inventions will be apparent from this description.

BRIEF DESCRIPTION OF THE DRAWINGS

The present invention is illustrated by way of example and not limitation in the figures of the accompanying drawings in which like references indicate similar elements.

FIG. 2A is an electrical schematic which illustrates an embodiment of a circuit for a tag according to one aspect of the invention.

FIG. 2B shows a structural representation of the circuit of FIG. 2A.

FIG. 11 is a flowchart which shows another exemplary method for manufacturing a golf ball.

FIG. 12A shows a first segment of an antenna which has been printed onto a surface, such as a golf ball core.

FIG. 12B shows the surface of FIG. 12A after a second segment of an antenna has been printed onto the surface; at this point, the antenna includes only the first and second segments.

FIG. 12C shows the surface of FIG. 12B after a third segment of an antenna has been printed onto the surface; at the point in time of FIG. 12C, the antenna includes all three of its segments.

FIG. 18 is an exemplary shaft which may be used in fixtures for holding golf balls during the manufacturing process.

FIG. 19A shows, in a side view, a portion of an exemplary fixture for holding a golf ball core during a method of manufacturing the golf ball core.

FIG. 19B shows, in another side view, the fixture of FIG. 19A. The portion of FIG. 19A is a horizontal support for the core.

FIG. 20 shows, in a side view, another portion of an exemplary fixture for holding the golf ball core during a method of manufacturing the core; the portion of FIG. 20 is a vertical support for the core.

FIG. 21A shows, in a side view, the horizontal support of FIG. 19A and the vertical support of FIG. 20 assembled together as a fixture holding a. core.

FIG. 21B shows, in another side view, a portion of the fixture.

DETAILED DESCRIPTION

Various embodiments and aspects of the invention will be described with reference to details set forth below, and the accompanying drawings will illustrate the invention. The following description and drawings are illustrative of the invention and are not to be construed as limiting the invention. Numerous specific details such as sizes and weights and frequencies are described to provide a thorough understanding of various embodiments of the present invention. However, in certain instances, well-known or conventional details are not described in order to not unnecessarily obscure the present invention in detail.

Figure 1A:
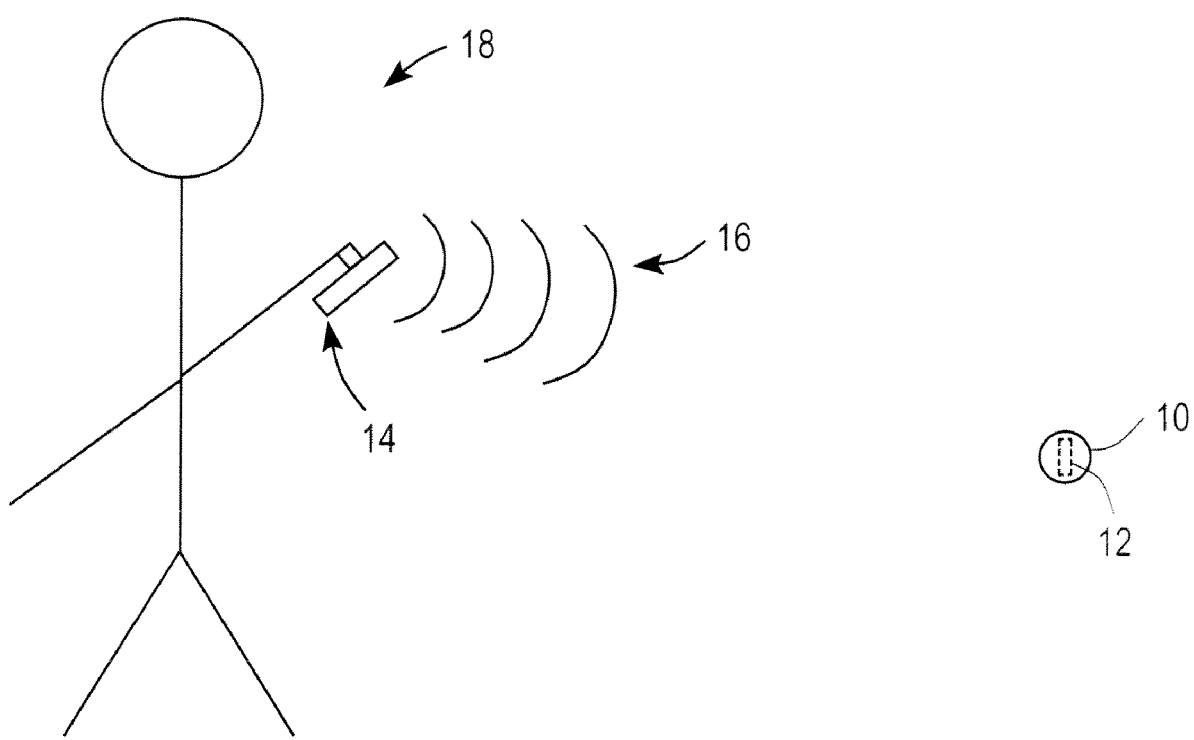
FIG. 1A shows a system for finding a golf ball according to one embodiment of the present invention.

FIG. 1A shows an example of the system which uses a handheld transmitter/receiver to find a findable golf ball. A person 18 such as a golfer, may carry a handheld transmitter/receiver which is designed to locate a findable golf ball 10 which includes a tag 12 embedded in the golf ball. The handheld transmitter/receiver 14 may operate as a radar system which emits an electromagnetic signal 16 which then can be received, converted and transmitted by the tag 12 back to the transmitter/receiver which can then receive the signal from the tag in a receiver in the handheld unit 14. Various different types of tags, such as tag 12, are described further below for use in the golf ball 10. These tags typically include an antenna and an electrical component such as a diode or an RFID IC coupled to the antenna. The diode serves to double the frequency of the received signal (or to provide another harmonic of the received signal), which makes it easier for the receiver to detect and find a golf ball as opposed to another object which has reflected the emitted signal without modifying the frequency of the emitted signal. The tag within the golf ball 10 is typically positioned such that the symmetry of the ball is substantially maintained. For example, the center of gravity (and symmetry) of a ball with a tag is substantially the same as a ball without a tag. The tag in certain embodiments is of such a weight and size so that the resulting ball containing the tag has the same weight and size as a ball which complies with the United States Golf Association specifications or the specifications of the Royal & Ancient Golf Club of St. Andrews ("R&A"). The various parts of a tag may be made with materials which are designed to match the density/specific gravity of the materials within the golf ball which are displaced by the tag. For example, the elastic conductive material, which may be used as an antenna in certain embodiments described herein, may be selected to have a density/specific gravity which approximates the density/specific gravity of a core material or a shell material of a golf ball. Furthermore, in certain embodiments, a ball with a tag has the same performance characteristics (e.g. initial velocity) as balls which were approved for use by the United States Golf Association or the R&A.

The handheld unit is preferably compliant with all regulations of the Federal Communications Commission and is battery powered. The batteries may be housed in the handheld 21, and they may be conventional batteries which may be placed into the handheld by a user or they may be rechargeable batteries which can be recharged either through the use of an AC wall/house socket or a portable rechargeable unit (e.g. in a golf cart). In order to comply with regulations of the Federal Communications Commission (FCC) or other applicable governmental regulations regarding radio equipment, the handheld may emit pulsed (or non-pulsed) radar signals with a power that is equal to or less than 1 watt. In certain embodiments, the handheld unit may emit through its transmitter pulsed radar signals up to 1 watt maximum peak power and up to 4 watts effective isotropic radiated power (EIRP). Thus, the handheld unit for locating golf balls may be sold to and used by the general public in the United States. Several embodiments of handheld transmitters/receivers are described in a prior U.S. patent application filed Jan. 17, 2003 as Ser. No. 10/346,919, by inventors Chris Savarese, et al. At least some of these embodiments may be sold to and used by the general public in countries other than the United States because the embodiments meet regulatory requirements of those countries. For example, a handheld unit for use and sale in the European Union will normally be designed and manufactured to meet the CE marking requirements and the National Spectrum Authority requirements per the R&TTE (Radio and Telecommunications Terminal Equipment) Directive. In other countries, the regulatory regimes in those countries would normally be considered in designing a handheld unit. While certain embodiments described herein use a handheld transmitting/receiving device to find a ball, it will be appreciated that alternative embodiments may use a transmitting/receiving device which is on a golf cart or on a golf bag or on other golf equipment or golf attire (e.g. a golf cap). These alternative embodiments may not be units which are designed to be held in a hand or they may also be holdable in a hand.

FIG. 2A shows an electrical schematic of a tag according to one embodiment. The circuit of the tag 50 includes an antenna having two portions 52 and 54. The portion 52 is coupled, through a transmission line 51, to one end of the diode 56 and the portion 54 is coupled, through a transmission line 53, to the other end of the diode 56. A transmission line 58 which forms an inductor is coupled in parallel across the combination of the diode 56 and the transmission lines 51 and 53 as shown in FIG. 2A. The diode 56 is designed to double the received frequency so that the transmitted signal from the tag is twice (or some harmonic) of the received signal. It will be appreciated that the double harmonic described herein is one particular embodiment, and alternative embodiments may use different harmonics or multiples of the received signal. FIG. 2B shows a structural representation of the circuit of FIG. 2A. In particular, FIG. 2B shows the antenna portions 52 and 54 coupled, through transmission lines 51 and 53, to their respective ends of the diode 56 which is in turn coupled to a transmission line 58. The diode may be a varactor diode, a Schottky diode, a step recovery diode or a transistor that is wired as a diode. In one exemplary embodiment of the circuit 50, the diode 56 may be a Schottky diode from Metelics Corporation, part number SMSD3004-SOD323, which is available in a package referred to as an SOD323 package. In an alternative embodiment, the diode 56 may be a Metelics diode in a leadless package such as an 05-03 package. In other embodiments, the diode 56 may, for example, be a diode from M/A-Com, part number MA4E2054-1141. The circuits shown in FIGS. 2A and 2B may be implemented in structures that have various different shapes and configurations as will be apparent from the following description. In alternative embodiments, tags may use an RFID IC (with an identification number) or other circuitry instead of a diode.

Figure 3A:
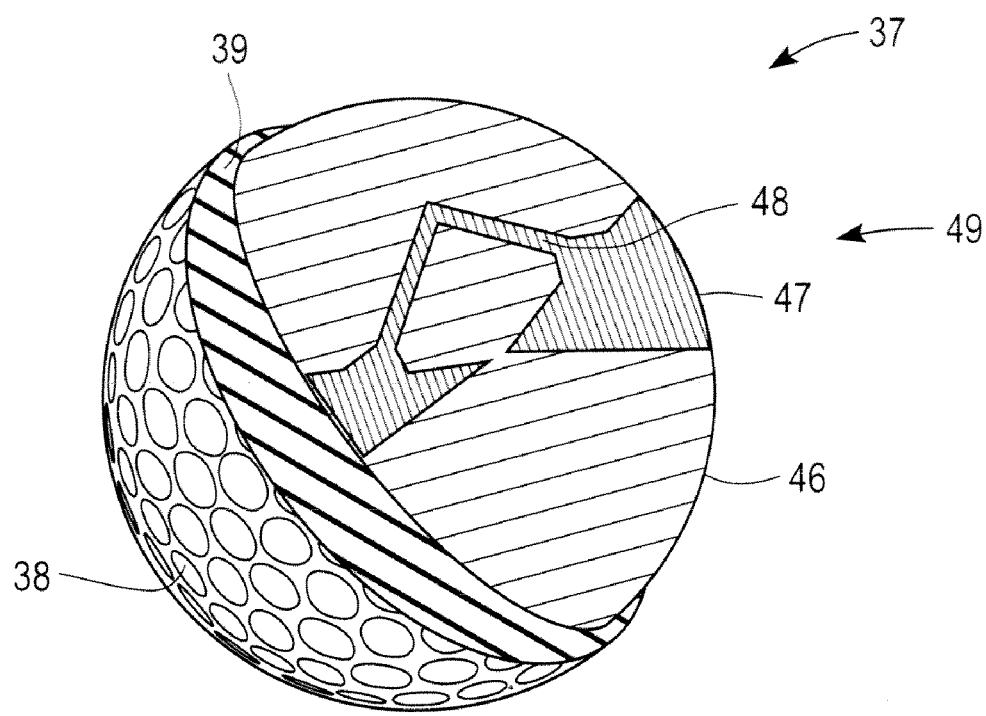
FIG. 3A shows a perspective view of a golf ball which has three pieces and wherein certain of those pieces have been removed partially in order to show the arrangement of a radial transmission line based antenna on the core of the golf ball.

FIG. 3A shows a perspective view of a three-piece golf ball having a core 46, a middle layer 39, and an outer shell 38. The core may be formed from various existing materials which are used to form golf ball cores, and particularly golf ball cores used in three-piece golf balls. Similarly, the middle layer 39 and the outer shell 38 may be formed with existing materials which are used in existing three-piece golf balls. The various different inventions described herein may be used on golf balls having three or more parts (e.g. a core, two mantle layers, and two hemispherical shells all joined together). The view of FIG. 3A shows the ball partially peeled so that it can be seen that the outer shell 38 normally surrounds the spherical core 46 as well as the layer 39. The golf ball of FIG. 3A includes a tag 49. The tag 49, in this embodiment, includes three components: an antenna 47, and inductive element 48, and a diode (not shown), or other semiconductor component, which is coupled between the two radial transmission lines which are separated and interconnected by the diode as further described below. The antenna 47 and the inductive element 48 may, in one embodiment of the invention, be formed from an elastic conductive material which is applied or deposited onto the core as described herein.

In one exemplary embodiment, the elastic conductive material may be a cured conductive ink which is elastic after curing, such as a conductive ink from Creative Materials, Inc. of Tyngsboro, Mass. Another example of such a substance is Electrodag PF-046 from Acheson Colloids Company of Port Huron, Mich. (see www.achesonindustries.com). Electrodag PF-046 is a screen printable, silver-filled polymer thick film based on a mixture of thermoplastic resins. It is formulated to provide outstanding flexibility, high conductivity, and excellent adhesion to a wide variety of substrates. The material has outstanding flexibility and is elastic after curing or drying. The elastic nature of this material tends to make it self-healing, even in the face of the extreme stress of being in a golf ball. For example, this elastic conductive material tends to be self-healing such that ruptures within the material will automatically be repaired by the material itself in a manufactured ball. This result is indicated by RF response testing on actual golf balls. In other words, hitting a manufactured ball will often reduce its RF response initially (e.g. the maximum detectable distance to the ball may be reduced initially after hitting the ball) but its RF response will improve over time as the antenna self-heals within the ball. The material may be applied in a variety of ways including manual painting, ink jetting, pad printing, lithographic (e.g. transfer) printing, etc. The material may be applied through the use of a template, which is further described below. The conductive ink may itself be used to form a connection with the contact pads on a diode or a separate compressible, elastic conductor may be utilized to couple the contact pads of a diode to the respective radial transmission lines which make up the antenna 47. It has been found that the use of an elastic conductive material for the antenna allows for greater tag and ball durability than an all foil antenna which is placed between the core and the shell of a golf ball. It has been discovered that such a foil antenna will not survive cannon test hits. Thus, golf balls which use solely foil antennas will not satisfy durability requirements because such balls will not be findable after 1 or a few (e.g. less than 10) cannon test hits; in other words, after a few cannon test hits, the foil antenna will have cracked and been ruptured into pieces which cannot properly function and will not allow the ball to be found at distances greater than about 20 feet. Even if the ball survives cannon test hits, the tag will not, and thus the ball and the tag are not durably findable.

A generally accepted durability standard in the golf ball manufacturing industry involves the use of a cannon test hit. A golf ball is generally considered durable if it can survive about 40 cannon test hits. Normally, a sample of such golf balls are tested, and if most (more than 50%, and possibly as high as more than 80%) survive 40 cannon test hits, then the golf ball is considered sufficiently durable. Normally, a golf ball is considered to have survived if it shows no structural failures; a structural failure includes a crack or a seam or a distortion of the ball's shape (e.g. a flattened portion) or a removal of a portion of the ball (e.g. the shell separates from the core) or the ball is split into portions (e.g. it cracks into two hemispherical pieces). A typical cannon testing procedure uses a COR (and durability) tester machine from Hye Precision Products (www.hyeprecision.com). The machine has variable compressed air settings for selecting a desired pressure in order to obtain a desired initial velocity for a ball being tested. The machine has an automatic return system which collects the balls after they are hit and returns them for another hit. Typically, twelve (12) balls are loaded and each ball is automatically introduced on a cycle run. It takes about 12 seconds for each hit/cycle. A round of 12 balls will cycle through the machine every two minutes. The cycle allows a ball to cool down after each hit. A ball is loaded inside a barrel with a diameter slightly larger than the ball's diameter (barrel diameter=1.70" and barrel length=18"). The machine hits the ball with a plunger, driven at an air pressure of 39 psi (pounds per square inch), such that the ball is propelled through the barrel with an initial velocity of about 145 ft/sec. The ball is hit against a 3-inch metal block which is 21.5 inches away from the end of the barrel. The ball bounces off the metal block and goes into a return chute and is reloaded during a cycle with other balls. The ball is hit/cycled and reloaded 40 times.

Figure 3B:
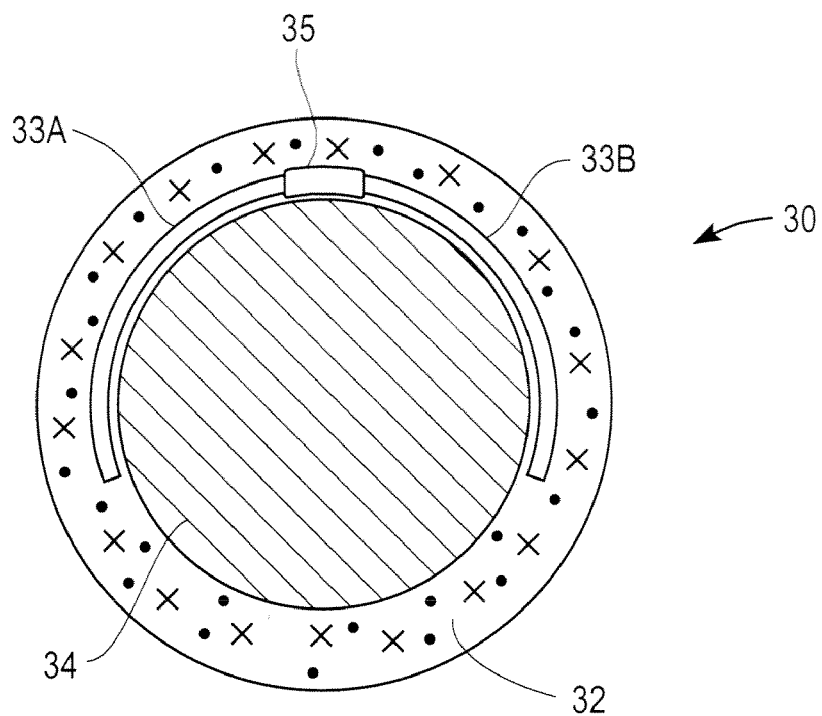
FIG. 3B shows a cross-sectional view of a two-piece golf ball with a tag between the shell and core of the golf ball.
Figure 3C:
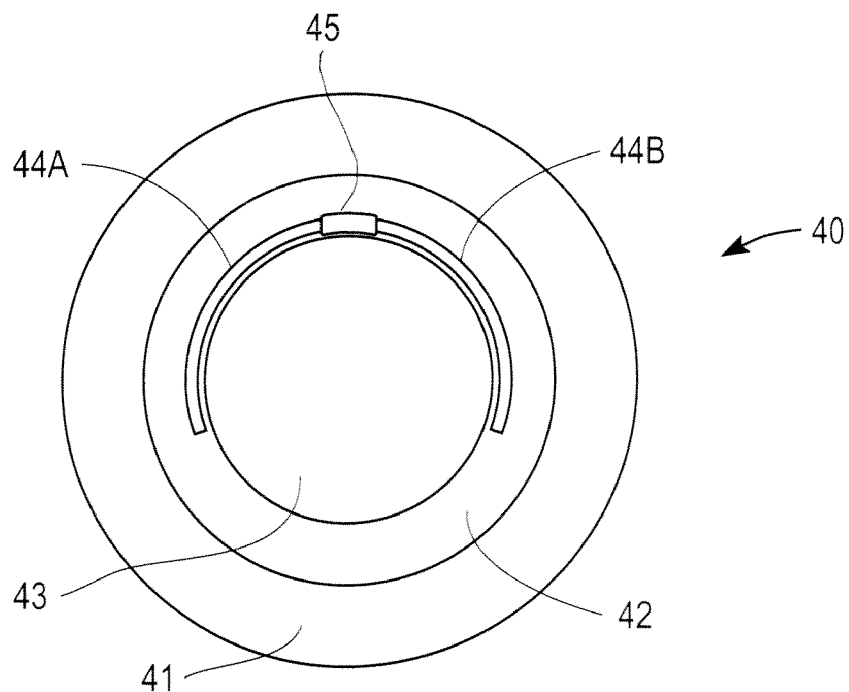
FIG. 3C shows a cross-sectional of a three-piece golf ball having a tag disposed between a middle layer and the core of the golf ball.

FIG. 3B shows a cross-sectional view of a two-piece golf ball which includes a tag between the core 34 and the shell 32. The golf ball 30 has a tag which includes a diode 35 and two antenna portions 33A and 33B. In one embodiment, the antenna portions 33A and 33B may be radial transmission lines which are described further below. FIG. 3C shows a cross-sectional view of a golf ball 40 which is a three-piece golf ball having a core 43 which is surrounded by a middle (or mantle) layer 42 which in turn is surrounded by an outer shell 41. A tag is disposed between the core 43 and the middle layer 42. This tag includes a diode 45 as well as antenna portions 44A and 44B. In an alternative embodiment of a three-piece ball, a tag may be disposed between the mantle layer and the outer shell layer. The antenna portions of the tag shown in FIG. 3B and the antenna portions of the tag shown in FIG. 3C (as well as the antenna portions of the tags shown in FIGS. 4A-4C and 6A-6D) may advantageously be fabricated using an elastic conductive material such as a conductive ink, which may be, in one embodiment, a polymer with metal particles disposed or dispersed in the polymer. The flexibility and elasticity of the antenna will allow the antenna and tag to withstand the tremendous stress placed on a golf ball when it is hit by a golfer.

Figure 4A:
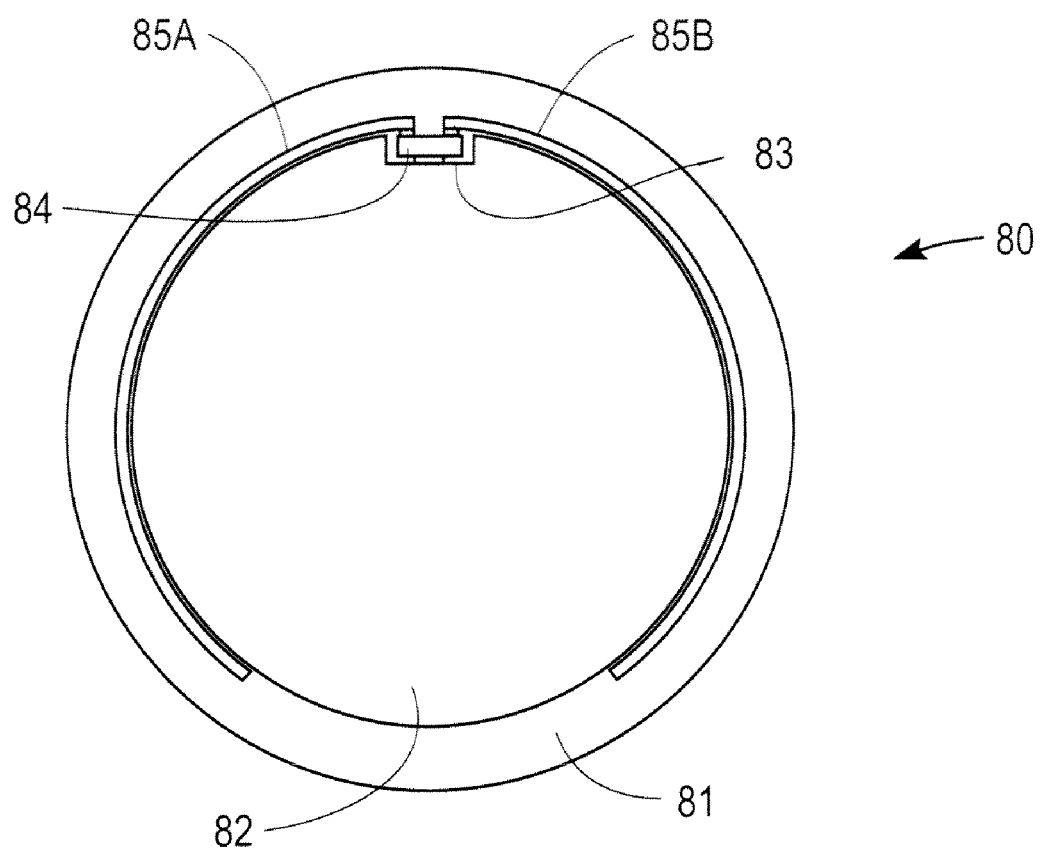
FIG. 4A shows a cross-sectional view of a two-piece golf ball which includes a void or cavity to receive an electrical component such as a diode.
Figure 4B:
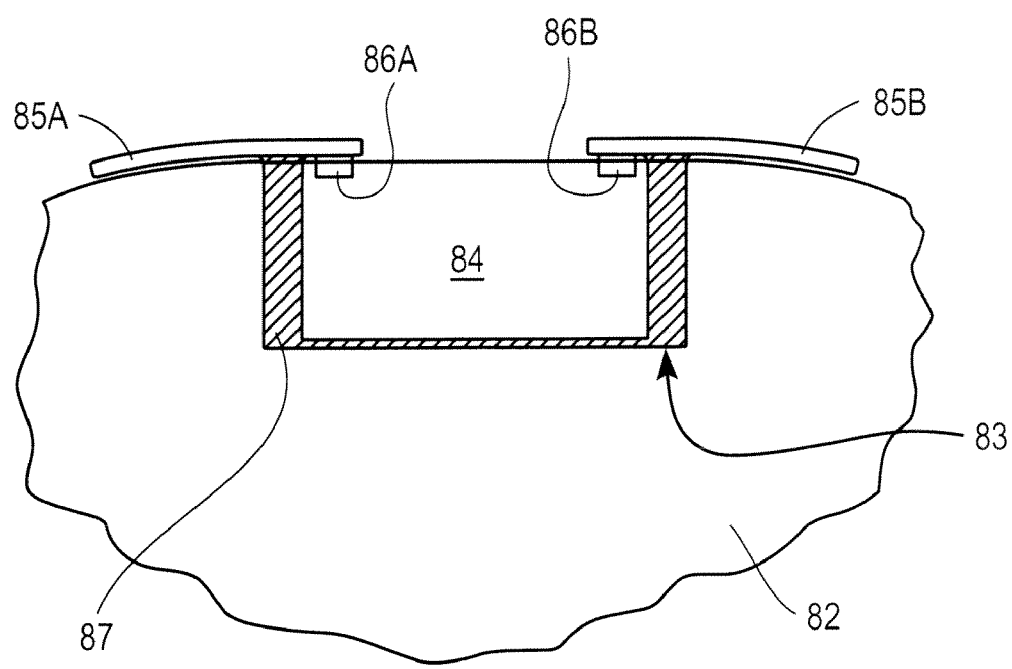
FIG. 4B shows an enlarged view of a portion of the golf ball shown in FIG. 4A.

FIG. 4A shows a cross-sectional view of a two-piece golf ball 80 which includes a core material 82 and a shell 81 which surrounds the spherical core material 82. A tag is disposed between the inner surface of the shell 81 and the outer spherical surface of the core material 82. This tag includes a diode 84 which is coupled between antenna portions 85A and 85B. The diode 84 is disposed at least partially in a void or cavity 83 in the core material 82 as shown in FIG. 4A. FIG. 4B shows, in cross-sectional view, an enlarged view of the portion of the core 82 around the void 83. It can be seen from FIG. 4B that the diode 84 is at least partially disposed in the void 83 and is coupled to the void 83 by an optional adhesive 87 which is disposed between the diode 84 and the core material 82. The adhesive may be similar to the filler material described below and may occupy substantially all space, in the void, which is not occupied by the diode 84. Such a use of the space in the void is shown in FIG. 4B. The filler material fills the gaps between the diode (or other semiconductor component) and the void's walls such that the filler is disposed around the side surfaces and bottom surface of the diode. The filler, by filling gaps, provides a relatively smooth and even surface to support an antenna. Over a short distance on the spherical surface, the filler and the upper edge of the void and the upper edge of the diode form a substantially planar surface which supports the antenna. Without the filler material, a trough may exist between the edge of the void and the diode and any antenna material applied across this trough may rupture when the ball is struck. The diode 84 includes electrical contact pads 86A and 86B which are coupled to respective portions of the antenna portions 85A and 85B. The diode 84 may resemble the leadless diode shown in FIG. 7A and in FIG. 7B. However, other configurations may also be used such as the diode shown in FIG. 7C.

Figure 5A:
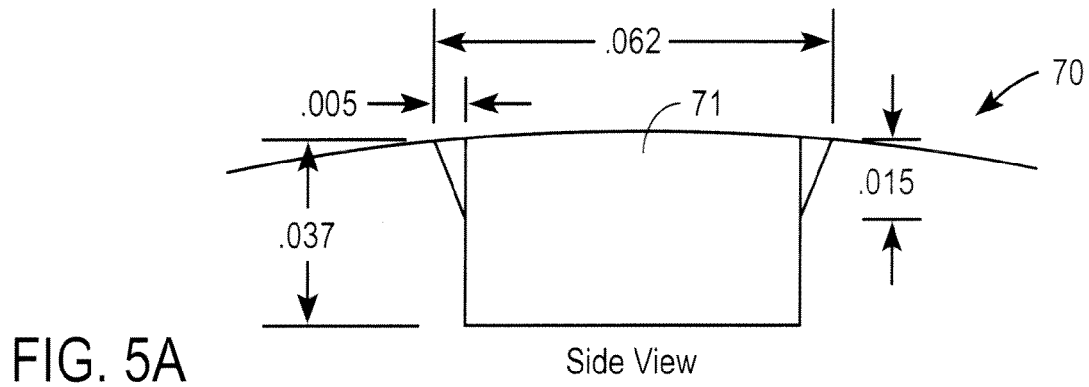
FIG. 5A shows a side view of an exemplary void in a golf ball core.
Figure 5B:
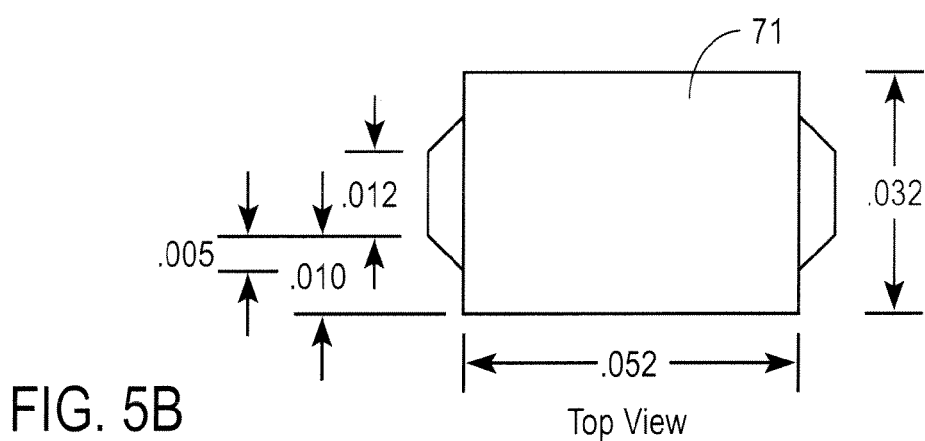
FIG. 5B shows a top view of the void of FIG. 5A.
Figure 5C:
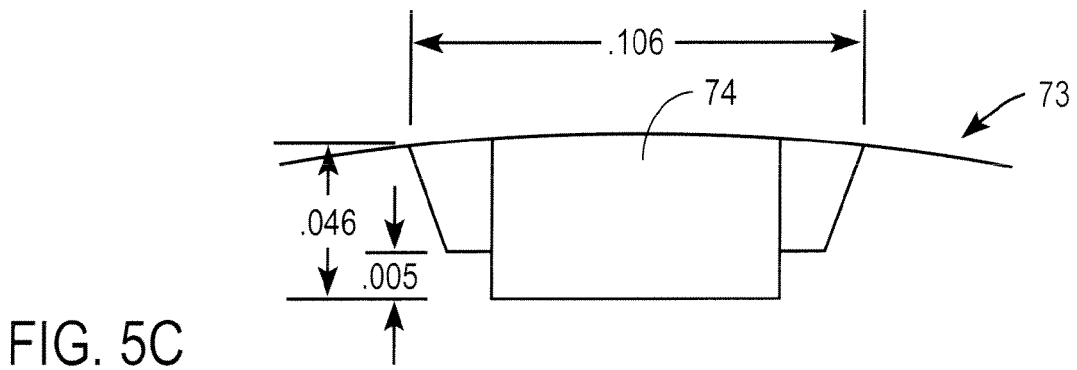
FIG. 5C shows a side view of another exemplary void in a golf ball core.
Figure 5D:
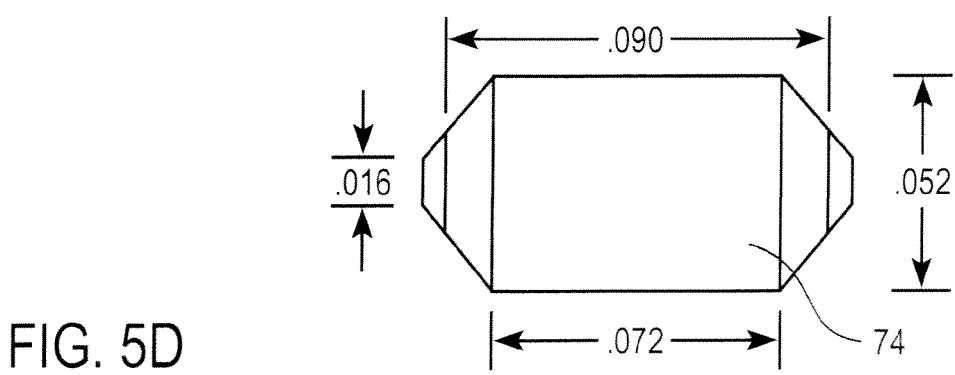
FIG. 5D shows a top view of the void of FIG. 5C.

The void in the core material 82 helps to protect the diode during the manufacturing process and helps protect the diode from harm when the golf ball is struck by a golfer. Thus this tends to improve the durability of a golf ball such as that shown in FIG. 4A. The void also tends to keep the diode (or other component) properly positioned and coupled to the antenna during an injection molding process when the ball is being manufactured. It has been discovered that without such a void, a diode tends to be dislodged away from the antenna during the injection molding process (e.g. when a shell is applied over the antenna and diode) and accordingly may result in the diode being disconnected from the antenna. A low profile diode (or other electrical component) may be placed in such a void or may be used without a void if its low profile permits such diode to be used in a manufacturing process (e.g. the injection molding process). Examples of voids are shown in FIGS. 5A-5D. FIGS. 5A and 5B show one type of void, and FIGS. 5C and 5D show another type of void. FIG. 5A is a side or cross-sectional view, and FIG. 5B is a top view of the void of FIG. 5A. FIG. 5C is a side or cross-sectional view, and FIG. 5D is a top view of the void of FIG. 5C. All dimensions are in inches. Alternative embodiments may use voids that have different shapes and/or different sizes from these shapes and sizes shown in FIGS. 5A-5D.

Figure 4C:
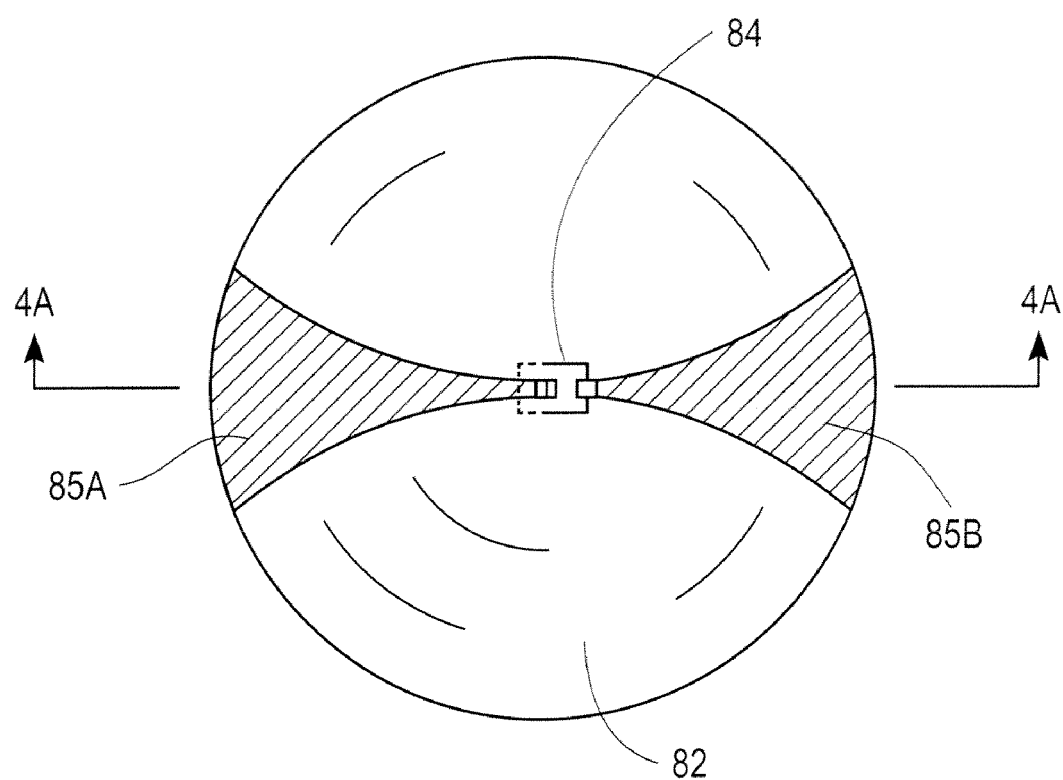
FIG. 4C shows a top perspective view of the golf ball of FIG. 4A, wherein the cross-sectional view of FIG. 4A is shown by the line 4A-4A in FIG. 4C.

FIG. 4C shows a top perspective view of the core and tag of a golf ball 80 with the shell 81 not yet applied over the tag and the core. The cross-sectional view of FIG. 4A is taken at line 4A-4A as shown in FIG. 4C. The antenna portions 85A and 85B are patterned as radial transmission lines, each of which are coupled to respective electrical contact pads on the diode 84. The use of radial transmission lines as the antenna portions for a tag in a golf ball are further described below and are also described in co-pending U.S. patent application Ser. No. 10/672,365 which is incorporated herein by reference. The antenna of the tag shown in FIG. 4C does not include an inductive element which is an optional element which may be added to the antenna pattern to improve electrical characteristics of the tag; for example, through the use of an inductive element, the impedance or reactance of the antenna may be matched with the impedance or reactance of the electrical component which in this case is a diode.

Figure 4D:
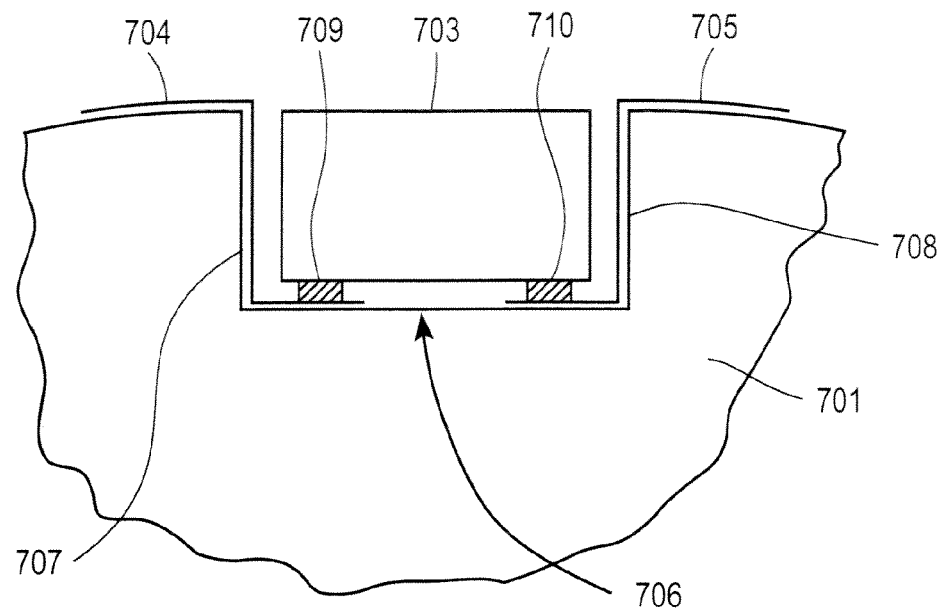
FIG. 4D shows a cross-sectional view of a core with a void and a semiconductor component in the void.
Figure 4E:
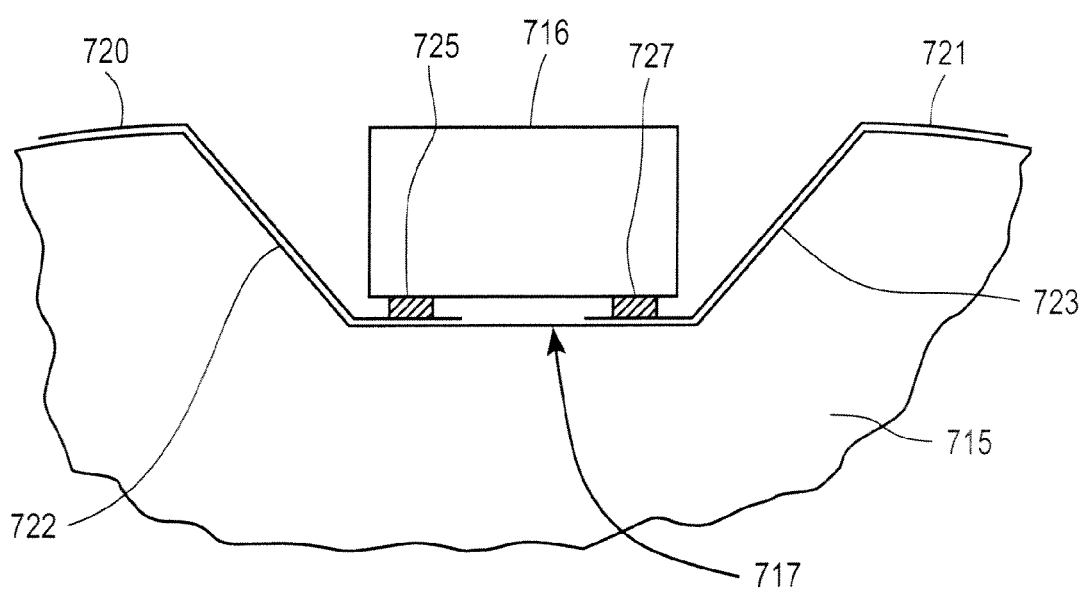
FIG. 4E shows a cross-sectional view of another core with an alternative void and a semiconductor component in that alternative void.

FIGS. 4D and 4E show, in enlarged cross-sectional views, portions of cores with voids and semiconductor components (e.g. a diode or RFID IC or other circuitry) in the voids. Unlike the embodiment shown in FIG. 4B, the electrical connection surface (e.g. bonding pads) of the semiconductor component in the embodiments of FIGS. 4D and 4E face a bottom surface of the void rather than facing out of the void. As shown in FIG. 4D, a semiconductor component 703 is situated in a void 706 in the golf ball core 701 and includes bonding pads 709 and 710 which connect the semiconductor component 703 to antenna portions 704 and 705 respectively. The antenna portion 704 is attached to wall 707 of the void 706 and is attached (mechanically and electrically) to bonding pad 709 at the bottom of void 706. The antenna portion 705 is attached to wall 708 of the void 706 and is attached (mechanically and electrically) to bonding pad 710 at the bottom of void 706. The antenna portions 704 and 705 would normally be applied to the surface of the core and to the sides and bottom of the void before depositing the semiconductor component 703 into the void 706. The bonding pads 709 and 710 may include a layer of conductive adhesive to adhere the bonding pads to their respective antenna portions. After the semiconductor component 703 is attached to antenna portions 709 and 710, a filler material may be deposited into the void 706 to surround the semiconductor component 703 on its sides and bottom and to fill gaps between the semiconductor component 703 and the void 706. It will be appreciated that, in an alternative embodiment, the electrical connection surfaces of the semiconductor component may be on the sides (rather than the bottom) of the void. The embodiment shown in FIG. 4E is similar to the embodiment of FIG. 4D except for the shape of the void in FIG. 4E. As shown in FIG. 4E, a semiconductor 716 is situated in a void 717 in the golf ball core 715 and includes bonding pads 725 and 727 which connect the semiconductor component 716 to antenna portions 720 and 721 respectively. The antenna portion 720 is attached to slanted wall 722 of void 717 and is attached (mechanically and electrically) to bonding pad 725 at the bottom of void 717. The antenna portion 721 is attached to slanted wall 723 of void 717 and is attached (mechanically and electrically) to bonding pad 727 at the bottom of void 717. After the semiconductor component 716 is attached to antenna portions 720 and 721, a filler material may be deposited in the void 717 to surround the semiconductor component 716 on its sides and bottom and to fill gaps between the semiconductor component 716 and the void 717.

Figure 6A:
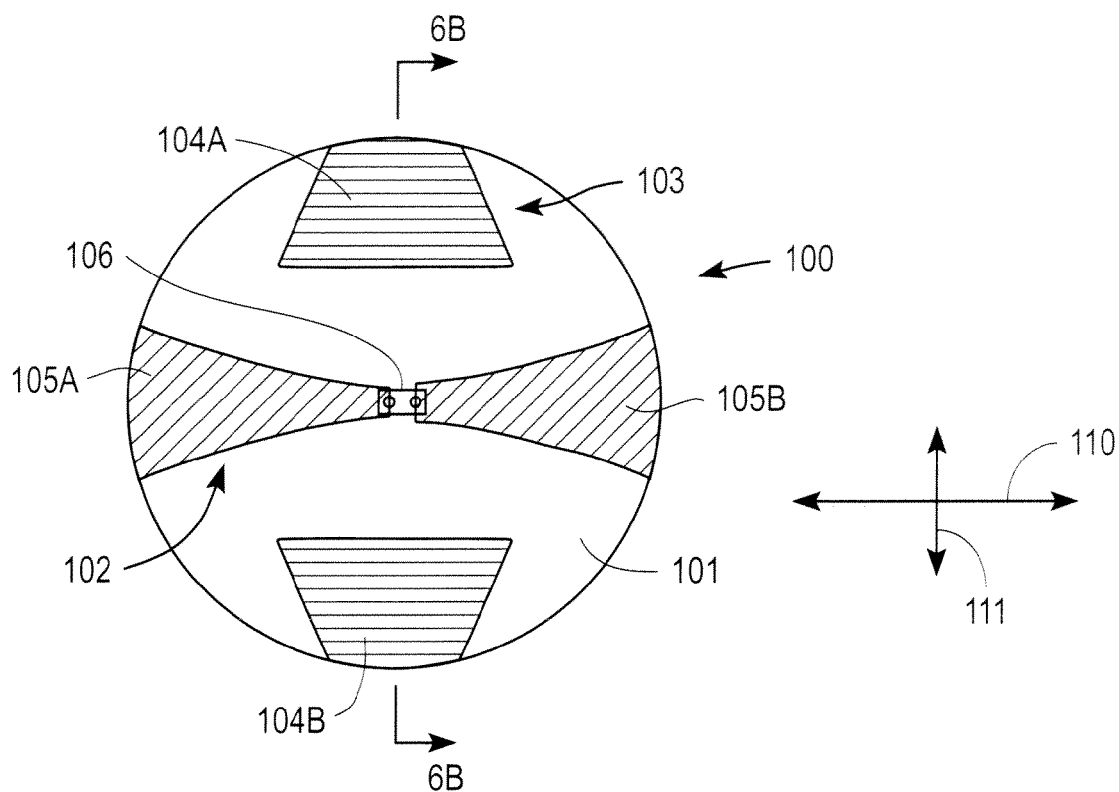
FIG. 6A is top perspective view of a core of a golf ball having a pair of tags, each of which includes radial transmission lines for their antenna patterns.
Figure 6B:
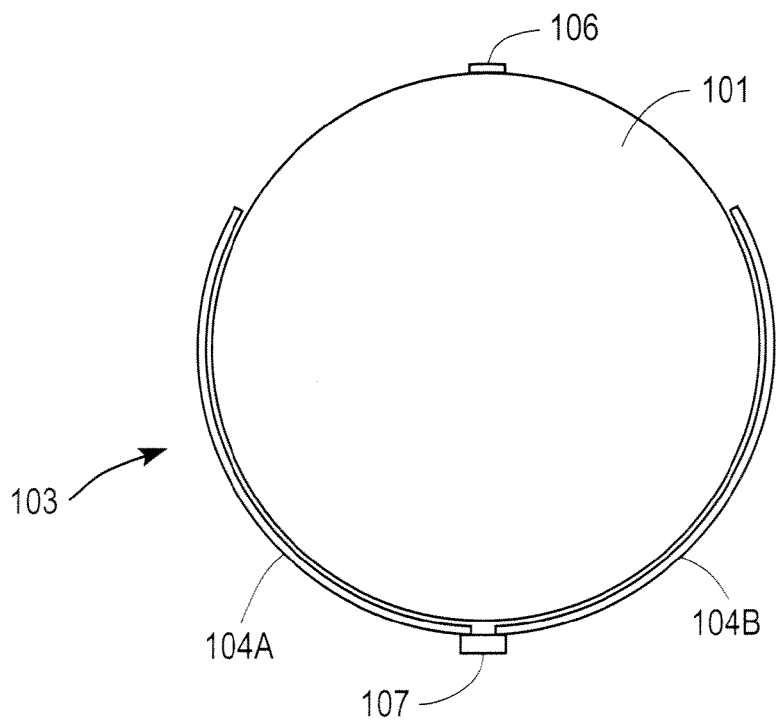
FIG. 6B shows a cross-sectional view of the core of FIG. 6A, where the cross-sectional view is taken through line 6B-6B shown in FIG. 6A.

Golf balls which have a single tag such as the ball shown in FIG. 3A may require more effort to find when the orientation of the antenna relative to the handheld transmitting/receiving device is such that most of the radiation transmitted from the handheld transmitting/receiving device is not received by the antenna. This can happen, for example, when the ball lands in an orientation in which most of the surface area of the antenna pattern is perpendicular to the plane of the transmitting antenna on the handheld transmitting/receiving device. In this case, very little if any electromagnetic energy is re-radiated back to the handheld device from the golf ball. The embodiments shown in FIGS. 6A, 6B, 6C, and 6D provide a golf ball which has greater detectability over a wider range of orientations relative to the handheld transmitting/receiving device. This greater detectability results from the substantially spherical coverage of the two independent tags which are arranged in a substantially orthogonal manner relative to each other. This can be seen from FIG. 6A, FIG. 6C, and FIG. 6D. The substantially orthogonal arrangement of the two independent tags each having an antenna pattern such as a radial transmission line antenna pattern provides for an adequate amount of surface area of the antenna (which non-perpendicularly faces the transmitting/receiving device) regardless of the orientation of the ball. FIG. 6A shows a top perspective view of a golf ball core 100 which includes two electrically independent tags 102 and 103, each of which includes a diode such as diode 106 or diode 107 and an antenna. In particular, tag 102 includes a diode 106 which is coupled in series between antenna portions 105A and 105B. The antenna portions 105A and 105B are each formed as a radial transmission line. The tag 103 includes antenna portions 104A and 104B and a diode 107 which is coupled in series between the antenna portions 104A and 104B. The tags 102 and 103 are disposed on a spherical surface of a core 101; it will be appreciated that alternatively, these tags may be disposed on a spherical layer which surrounds a core material. FIG. 6B shows a cross-sectional view of the core 100, where this cross-sectional view is taken at line 6B-6B as shown in FIG. 6A. The view of FIG. 6B shows the diode 107 coupled in series between the antenna portions 104A and 104B. It will be appreciated that the diode 107 is underneath the view shown in FIG. 6A.

The substantial orthogonality of tags 102 and 103 can be seen by noting the angle of intersection between the axes 110 and 111. This intersection is substantially a right angle (90°). The axis 110 represents the major axis formed by antenna portions 105A and 105B. Similarly, the axis 111 represents the major axis formed by antenna portions 104A and 104B. While the example shown in FIG. 6A shows the two tags arranged in an orthogonal orientation, it will be appreciated that slight deviations from perfect orthogonality may be used in certain embodiments; for example, a deviation of approximately about 10° to about 20° from a perfect 90° angle may still achieve desirable results and still be substantially orthogonal.

Figure 6C:
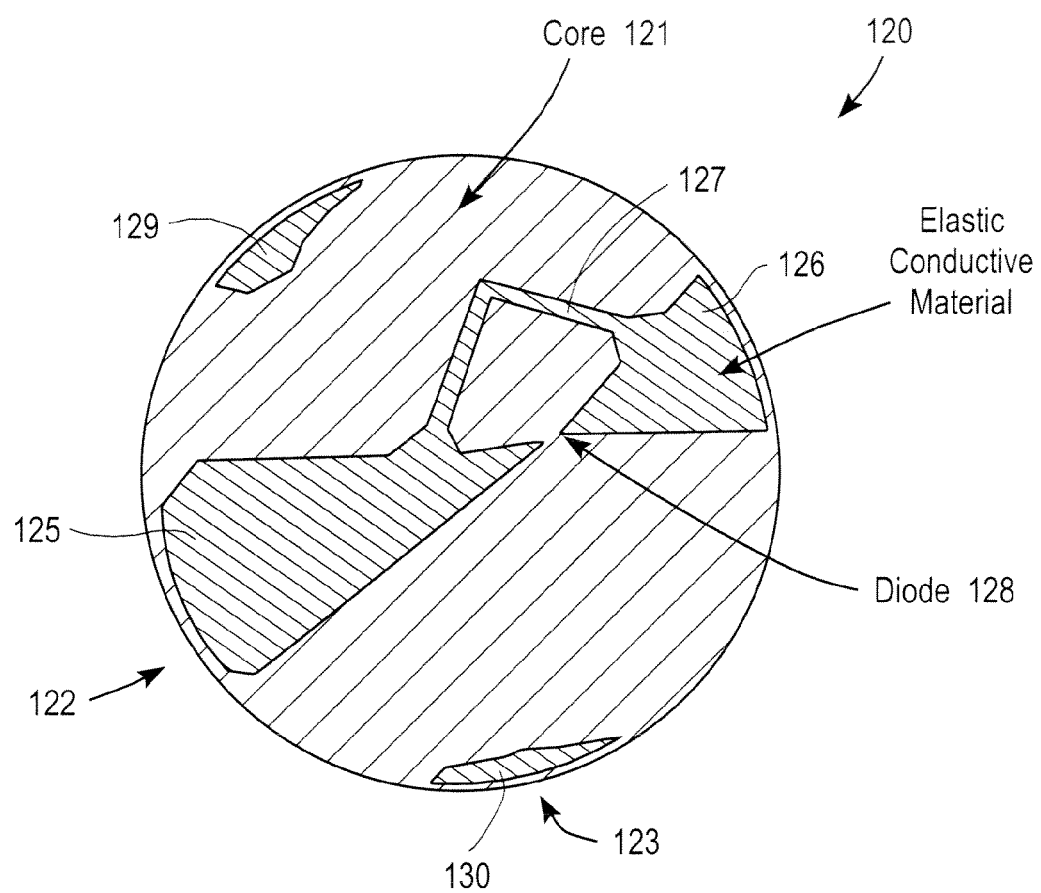
FIG. 6C is a side perspective view of a core of a golf ball which includes two tags, each of which have a pair of radial transmission lines to form an antenna pattern for each tag.

FIG. 6C shows a side perspective view of a golf ball 120 prior to the completion of the fabrication of the golf ball. In particular, a core 121 is shown with two tags 122 and 123 disposed on the outer spherical surface of the core 121. Each tag includes an antenna portion made out of an elastic conductive material and a diode, such as diode 128. Further, each tag includes an inductive element, such as inductive element 127 which is part of the tag 122. The tag 122 includes antenna portions 125 and 126 which are shaped as radial transmission lines. Similarly, the antenna portions 130 and 129 of the tag 123 are shaped as radial transmission lines. It can be seen from FIG. 6C that the tags 122 and 123 are arranged in a substantially orthogonal orientation relative to each other.

Figure 6D:
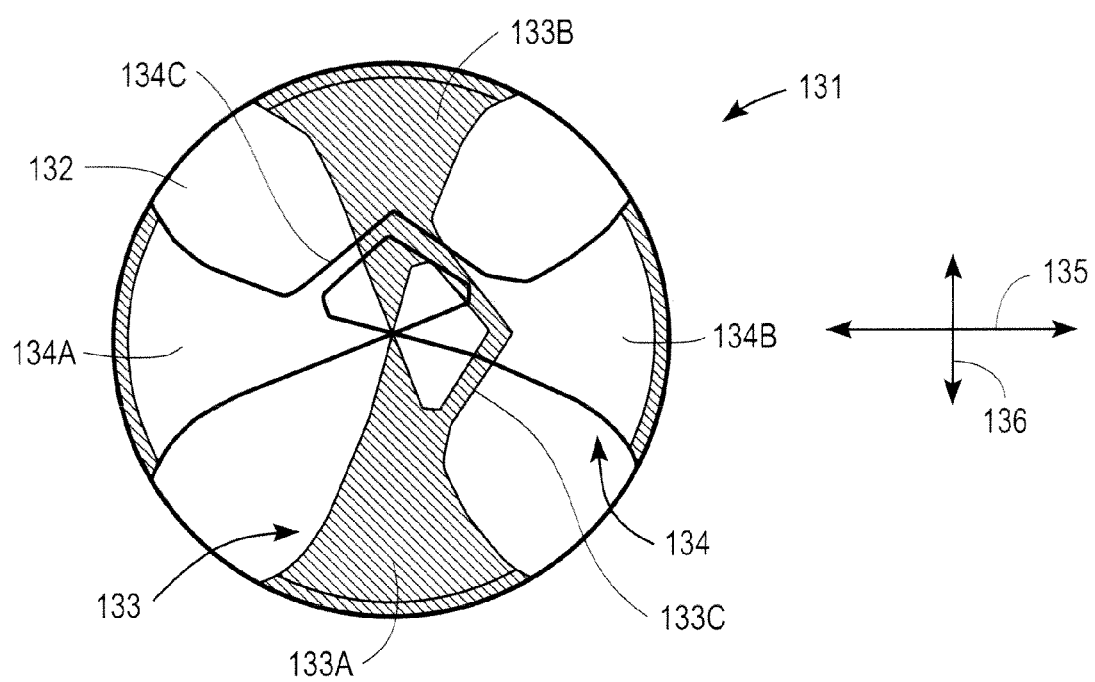
FIG. 6D is a view through a transparent core showing the orthogonal arrangement of the two tags relative to each other.

FIG. 6D shows a view of two tags disposed on the transparent core such that the two tags may be seen from the top perspective view shown in FIG. 6D. The portion of the golf ball 131 includes a core material 132 onto which are deposited an antenna material to form the antenna portions of tags 133 and 134. Each tag includes an antenna and a diode coupled in series between the two antenna portions which form the antenna. Each tag further includes an inductive element. In particular, tag 133 includes antenna portions 133A and 133B which are coupled in series with a diode (not shown) and also includes an inductive element 133C which is coupled between the two antenna portions 133A and 133B. This tag 133 is shown at the bottom of the transparent core material 132. Tag 134 includes antenna portions 134A and 134B and a diode (not shown) which is coupled in series between antenna portions 134A and 134B. The tag 134 further includes an inductive element 134C which is coupled between the antenna portions 134A and 134B. The tag 134 is shown on the upper surface (facing the viewer) of the core material 132. It can be seen that the tags 133 and 134 are substantially orthogonally arranged relative to each other by observing the axes 135 and 136. Axis 135 represents the major axis of tag 134 and axis 136 represents the major axis of tag 133. These axes intersect at a right angle as shown in FIG. 6D. Thus, the two tags 133 and 134 are arranged substantially orthogonally relative to each other around the spherical surface of the core material 132. It can be seen from FIG. 6D that the antenna pattern for each of the antenna portions is arranged as a radial transmission line.

In an alternative embodiment, a golf ball may include three substantially orthogonal tags on the core (or on one or more mantle layers). The three substantially orthogonal tags may be arranged so that their 3 main axes are perpendicular to each other. This may be done by arranging the 3 main axes of the 3 tags to be parallel with a virtual x,y,z rectilinear coordinate system. These 3 substantially orthogonal tags provide for substantially spherical coverage. In the case of a golf ball with three tags, the limited space on the ball may restrict the size of each antenna which may in turn restrict the operating frequency range of the antenna (e.g. the tags may function at an excitation frequency such as 2400 MHz, which may be available in, for example, Australia, Europe and other countries). Each of the three tags may be implemented as a circuit shown in FIG. 2A and may use radial transmission lines as antenna portions, and these antenna portions may be formed, at least in part, from an elastic conductive material such as an elastic conductive ink.

While the embodiments shown in FIGS. 6A-6D show the use of two or more functional tags, it is possible in certain alternative embodiments to use a single functional tag (e.g. as in FIG. 3A). This single tag may optionally be combined with another non-functional (dummy) tag which does not operate to indicate the presence of the ball. This may be done to achieve improved symmetry and lower cost (since a functioning diode is not required to be used for the dummy tag). The improved symmetry may be obtained by using materials for the dummy tag which substantially or approximately match the weight and density/specific gravity of the components of the functional tag such that the ball maintains its symmetry.

Figure 7A:
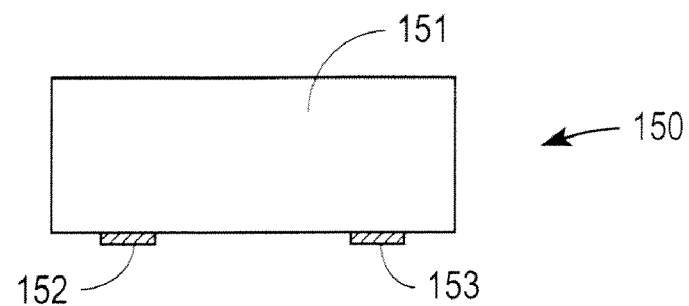
FIG. 7A is a side view of a leadless diode.
Figure 7B:
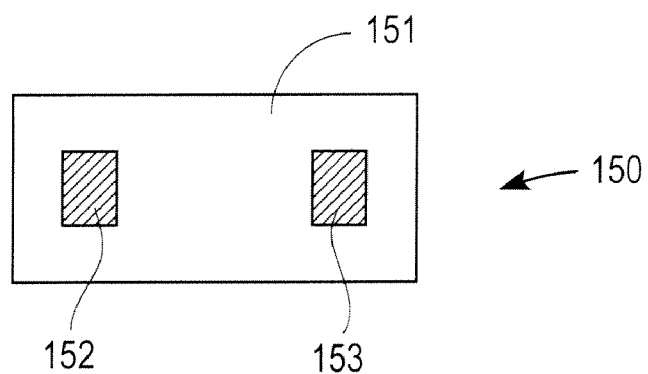
FIG. 7B is a bottom view of the leadless diode of FIG. 7A.
Figure 7C:
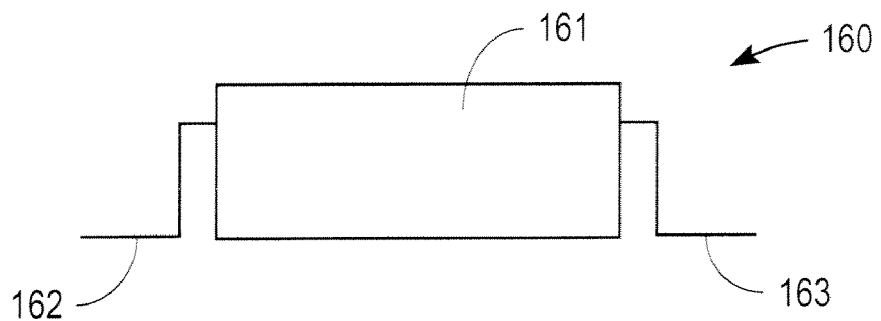
FIG. 7C is a side view of a diode which includes leads.

An electrical component is typically used to make various tags described herein. One such electrical component is a diode shown in the electrical schematic of FIG. 2A. Alternatively, a transistor or other types of components (e.g. an RFID integrated circuit or other types of circuitry) may be utilized. The electrical component is typically housed in a package which encases the component to protect it from the environment. FIGS. 7A-7C show two examples of the packaging for a diode or an IC. It will be appreciated that other types of packaging (e.g. a low profile package) may alternatively be used. The diode 150 shown in FIG. 7A and 7B includes a package 151 with two electrical contact pads 152 and 153. This particular package may be considered a leadless package. The contact pads 152 and 153 may be coupled directly to corresponding antenna portions such as the manner shown in FIG. 4B where the pad 86A and the pad 86B of FIG. 4B correspond to pads 152 and 153 of FIG. 7A and 7B. The connection between the antenna portions and the corresponding contact pad on the diode may be made by a compressible, elastic conductive adhesive or by an elastic conductive ink which is painted onto the pad on the antenna portion. The diode 150 may be disposed within a void as shown in FIG. 4B or may be disposed on top of a surface (without a void) such as in FIG. 6B. The contact pads may face away from the center of the golf ball core, such as in the case of FIG. 4B, or may face toward the golf ball core, as in the case of FIG. 6B and FIGS. 4D and 4E. It will also be appreciated that the end portions of the antenna portions may extend into the void, such as void 83, and the contact pads of the diode may face toward the center of the core and contact the antenna portions within the bottom portion of the void. FIG. 7C shows an alternative diode package which includes leads 162 and 163 which extend outwardly from the package 161. This diode 160 may be used in various embodiments described herein rather than the leadless diode 150 shown in FIGS. 7A and 7B.

While many of the embodiments of tags described herein use an antenna having portions which are patterned in the form of radial transmission lines, it will be appreciated that alternative embodiments of tags, for use in golf balls, may use antennas having different patterns such as a folded dipole pattern or other patterns (e.g. see the antennas in FIGS. 1 and 2 of published European Patent Application EP1035418A1), which different patterns do not include radial transmission lines. Antennas which are not patterned with radial transmission lines may be configured to be substantially orthogonal such that the major axes of the antennas are substantially perpendicular. Antennas which do not include radial transmission lines may be formed from an elastic conductive material (e.g. an elastic conductive ink), and they may be coupled to diodes which are disposed at least partially in voids, and they may be manufactured using any one of the techniques described herein (e.g. painting or spraying or ink jetting or the use of a template for manual painting, etc.).

Certain embodiments of the tags may be designed so that the antenna of the tag has two radial transmission lines with a natural resonant frequency between an excitation frequency from a transmitting/receiving device (e.g. handheld unit 14), which is designed to find the ball containing the tag, and a harmonic (e.g. second harmonic which is twice the excitation frequency) of the excitation frequency. These certain embodiments may be further designed such that an impedance of the diode, which is coupled between the two radial transmission lines of the antenna, is substantially tuned to an impedance of the antenna at both the excitation frequency (e.g. 915 MHz) and the re-radiated frequency (e.g. 1830 MHz) of the signal returned by the tag. The use of radial transmission lines in the antenna will tend to ease tolerance parameters for the diode (relative to tolerance parameters for a diode used with a non-radial transmission line antenna); for example, tolerance range of a diode's capacitance may be enlarged by using an antenna with radial transmission lines.

Methods of manufacturing golf balls, such as those described herein, are set forth herein. The various golf balls described herein, such as the golf ball shown in FIGS. 3A-6D, may be constructed in a manner such that they comply with the golf ball specifications of the U.S. Golf Association or of the Royal and Ancient Golf Club of St. Andrews. For example, the weight of the golf ball with the tag will not exceed 45.927 grams (total ball and tag weight). The size and shape of the golf ball as shown in, for example, FIG. 3A, is within the specifications for a golf ball of the USGA (United States Golf Association) or the Royal and Ancient Golf Club of St. Andrews, and thus the weight and size of such golf ball complies with the specifications. Furthermore, it has been determined that golf balls having the various tags described herein, such as the golf ball shown in FIG. 3A, have sufficient durability to comply with the durability standards of the golf ball manufacturing industry (e.g. the balls survive 40 cannon test hits). For example, a golf ball and tag of the form constructed in the manner shown in FIG. 3A will normally survive many cannon hits which is the conventional way of testing the durability of golf balls. Most of the golf balls and tags designed according to the embodiments described herein will survive at least 20 cannon hits and many (e.g. more than 50%) such golf balls survive 40 or more cannon hits, which is considered to be the desired goal for durability of golf balls. High durability, in one minimum requirements embodiment, of both the tag(s) and the golf ball may be considered to be achieved when most (e.g. more than 50%) of the balls in a sample of balls survive 20 standard cannon test hits and most of the balls are still detectable (e.g. findable) over a range of at least 20 feet after the 20 standard cannon test hits. High durability, in another embodiment, of both the tag(s) and the golf ball may be considered to be achieved when most (e.g. more than 50%) of the balls in a sample of balls survive 40 standard cannon test hits and most of the balls are still detectable (e.g. findable with a handheld transmitting/receiving unit such as unit 14) over a range of at least 20 feet (between the transmitting/receiving unit and the ball) after the 40 standard cannon test hits. Having extra tags within a ball (e.g. a second or third tag) will improve the likelihood that the ball will be detectable over a range of at least 20 feet after 20 or 40 cannon hits because if one tag fails after a certain number of hits, other tags within the ball will probably continue to function and the ball is still findable (especially if golfers use a technique, described below, which includes rotating the transmitting/receiving device). Furthermore, the flight characteristics (e.g. initial velocity) of the golf balls described herein substantially comply with the flight characteristics of golf balls specified by the U.S. Golf Association or the Royal and Ancient Golf Club of St. Andrews. Thus the overall distance the ball travels with normal hits, its initial velocities and other parameters normally specified in the requirements of the USGA or the Royal and Ancient Golf Club of St. Andrews under their standard testing procedure can be satisfied by the golf balls fabricated as described in the various embodiments herein.

Figure 8:
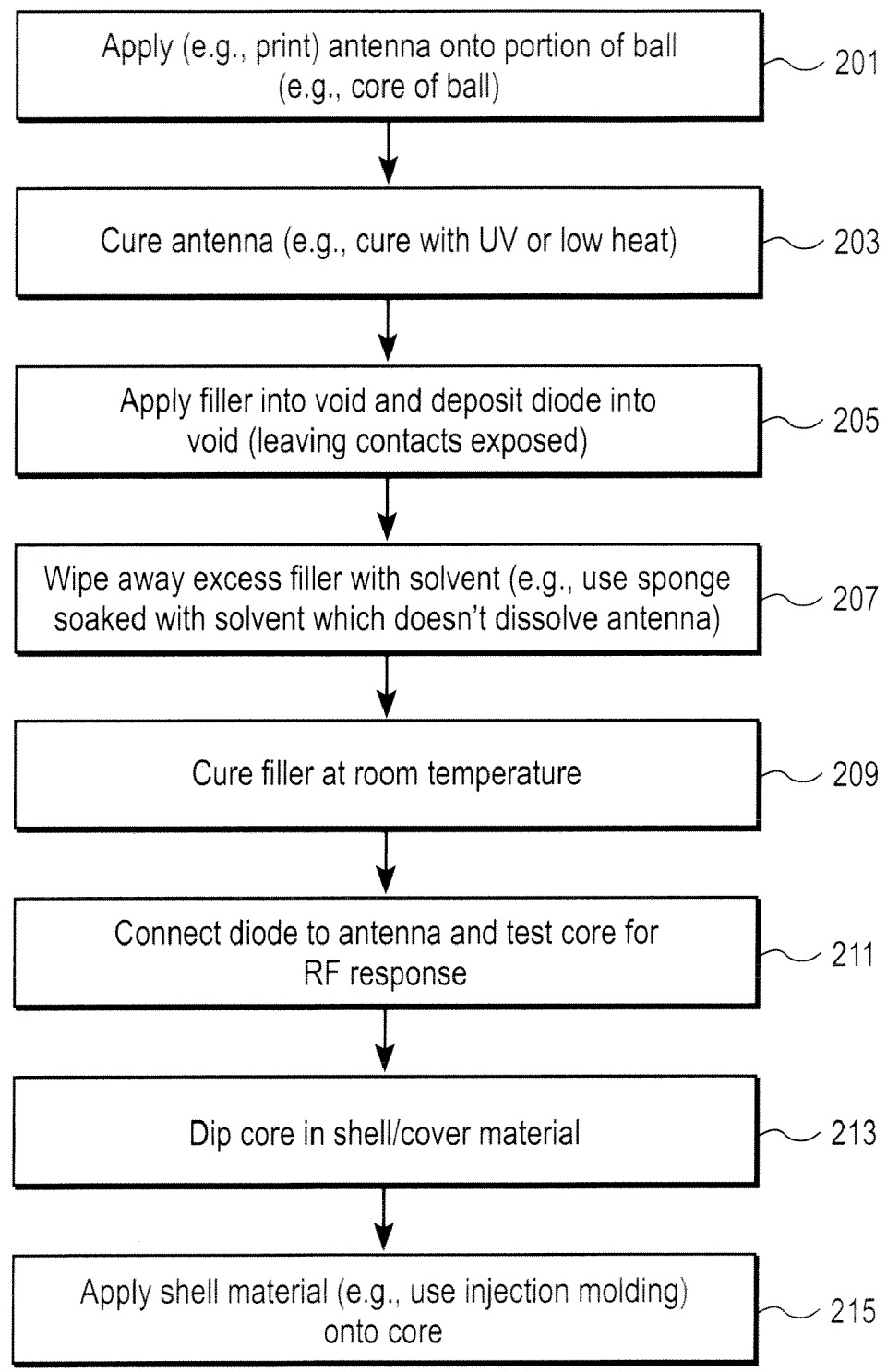
FIG. 8 is a flowchart which shows an exemplary method for manufacturing a golf ball.

FIG. 8 shows an exemplary method for manufacturing a golf ball which includes a void and a filler material within the void and an electrical component, such as a diode or an RFID IC, in the void with the filler material. FIG. 4B shows an example, in cross-sectional view, of an electrical component in a void with a filler material. The method shown in FIG. 8 may begin in operation 201 in which an antenna is applied onto a portion of a ball, such as the core of a ball or a mantle layer of the ball. An antenna may be applied in a variety of different ways, such as pad printing, ink jetting, screen printing, sputtering, or etching. In certain embodiments described herein, pad printing is utilized to form different segments of an antenna. After the antenna is applied, it is cured in operation 203. This may involve a heat curing or a curing with ultraviolet (UV) radiation. The heat may be a low heat, such as a temperature of less than about 200° C., for a short period of time (e.g. less than 15 minutes). After the antenna is properly cured, a filler is applied in operation 205 into the void on the portion of the ball, and an electrical component, such as a diode, is deposited into the void. Typically, the contacts of the electrical component are exposed as they face away from the bottom of the void. In operation 207, any excess filler material is wiped away with a solvent, and the wiping may use a sponge or cloth soaked with a solvent. For example, a lint-free cleaning material may be used to wipe away any excess filler material. The solvent may be selected to dissolve the filler material but not the antenna material. In operation 209, the filler is cured at room temperature in at least certain embodiments, and then in operation 211, the electrical component, such as a diode, is coupled to the antenna, and the portion of the ball, such as a core of the ball, is tested for RF response. The test may include exposing the core to RF emissions from a handheld unit or other RF frequency source and determining if there is an adequate RF response from the tag on the core being tested. If the core passes the test (e.g. the tag on the core provides sufficient RF response), then the core is dipped in a shell or cover material in operation 213. Alternatively, the core may be sprayed with the shell or cover material. This operation 213 is before the injection molding process and is designed to coat the core with the shell material before the injection molding process so that the electrical component remains in the void during the injection molding process. It has been found that the forces applied to the core during an injection molding process may dislodge the electrical component from the void. The risk of dislodging the electrical component from the void during the injection molding process may be reduced by operation 213. The material which is applied in the dipping or spraying of the core may be the actual shell material or mantle material which is used in the injection molding process or another material which is compatible with the shell or mantle material. In operation 215, a shell material is applied onto the core or other portion of the ball. In one exemplary embodiment, the shell material may be applied by an injection molding process.

The method of FIG. 8 may be used with either a two-piece ball or a three-piece ball which includes a mantle layer. The antenna and void may be applied on the core in the case of a two-part ball, and in the case of a three-part ball, the antenna and the void may be formed on either the core or the mantle layer. Each ball may have one or more antennas and a corresponding void and electrical component, such as a semiconductor component or element (e.g. a diode or an RFID IC). For example, the method of FIG. 8 may be used to fabricate a golf ball which includes two antennas, each coupled to a corresponding diode, which is disposed within a corresponding void. In this case, the golf ball includes two diodes, two voids and two antennas, which may be arranged in a substantially orthogonal manner such as that shown in FIG. 6A.

The filler material and the electrical component, such as a diode, which is disposed within the void, fill up substantially all of the volume in the void in at least certain embodiments. The filler material may be selected such that it cures by virtue of a chemical reaction rather than a physical process such as evaporation. In this case, the filler material may be placed into the void in a liquid state and may occupy a first volume in the liquid state, and after curing, the solid or gel-like result of the cured filler material may occupy substantially the first volume. That is to say, in at least certain embodiments, the filler material occupies substantially the same volume both before and after curing. There is essentially no shrinkage or loss of volume due to evaporation in these certain embodiments. In one exemplary embodiment, the difference in volume between the liquid state and the solid state is less than about 0.189% of the liquid state. Further, there are no bubbles or voids within the filler material. In certain preferred embodiments, the filler material is a two-part epoxy resin from Creative Materials, Inc. of Tyngsboro, Mass. In certain embodiments, the filler material is cured at temperatures less than about 90° F., and preferably at temperatures between 65° F. and 75° F. Thus, the filler material is cured, in at least these certain embodiments, at substantially room temperature with relative humidities of about 30%-60% for about 120 minutes; the curing time may be in a range from about 40 minutes to over about 200 minutes.

The filler material may act as an adhesive which secures the electrical component, such as a diode or RFID IC, to the void. The wiping away of excess filler ensures that the filler is within the void and does not cover the contact pads of the electrical component, such as a diode or RFID IC. The filler material is typically used, in at least certain embodiments, to take up all spaces between the electrical component and the void walls. The filler, when it is an adhesive, adheres to the electrical component and void wall to form a bond such that they are virtually inseparable. The filler material may be used to form a completely smooth and even surface between the top surface of the electrical component, such as the diode or RFID IC, and the core's surface. This smooth and even surface is typically as smooth as the smoothness of the surface of a conventional finished golf ball core. The flat surface provides support for a bond paint layer, which is applied to bond the bonding pad or chip contact on the electrical component, such as a diode or RFID IC, and the antenna which is applied onto the core or other portion of the golf ball. This prevents the bond paint from collapsing under pressure from ball cover mold injection processes. Without the support of the filler material between the diode and the end wall of the void, the bond paint may collapse to form a mini trench, and this trench can break when the ball is struck by a club or during cannon shot durability testing. The filler material may be applied when it is in a very soft state, allowing it to run into gaps. The application procedure for applying the filler material may involve the use of a small wooden or plastic stick to insert the filler material into the void. The stick may be stirred around to make sure all inside edges of the void are coated with the filler material. An alternative application method may be to use a syringe to deposit a premeasured amount of adhesive filler into the void. The electrical component may be inserted into the void before or after inserting the filler material into the void. In certain preferred embodiments, the electrical component is inserted into the void after depositing the filler material into the void. In this case, it may be desirable to make sure that some amount of the filler material overflows out of the void and onto the surface of the core of the ball. The electrical component may be pressed into the void, and the contacts on the electrical component are wiped clean with a cloth or sponge which has been wetted with a solvent which is capable of dissolving the filler material. Having at least some amount of overflow of the filler material outside of the void should guarantee that all of the space in the void which is not occupied by the electrical component has been taken up by the filler material. Having a filler material which is water soluble allows the process to overflow the filler and yet still be able to maintain clean electrical component contacts by wiping the electrical component contacts clean with a sponge or cloth soaked in water. Further, water does not affect at least certain of the conductive elastic inks which are used as antenna materials as described herein.

It is desirable in at least certain embodiments to have a controlled manufacturing environment in which all materials are kept at the same temperature and humidity conditions while manufacturing consecutive batches of golf balls. A holding area in an environmentally controlled room with a stabilized temperature of 21° C. to 22.5° C. (and a stabilized relative humidity) has been determined to be, for at least certain embodiments, preferred for printing results using at least certain of the conductive inks and filler materials described herein. The environmentally controlled room maintains a stabilized and relatively constant temperature and relative humidity from batch to batch of golf balls and may be used to temporarily store the conductive inks and apply the conductive inks onto cores (unless the conductive inks require refrigeration). The curing of the filler material at 21° C. to 22.5° C. may be performed for about one hour to harden the filler material. In at least certain embodiments, it is important to cure at room temperature or at temperatures not to exceed 30° C. to have the least effect on the core composition and thus its performance. The filler material may also be used to fill imperfections around the voids to give a smooth surface for printing with conductive ink in those embodiments in which the antenna is applied after applying the filler into the void, as in the case of FIG. 9A, which will now be described.

Figure 9A:
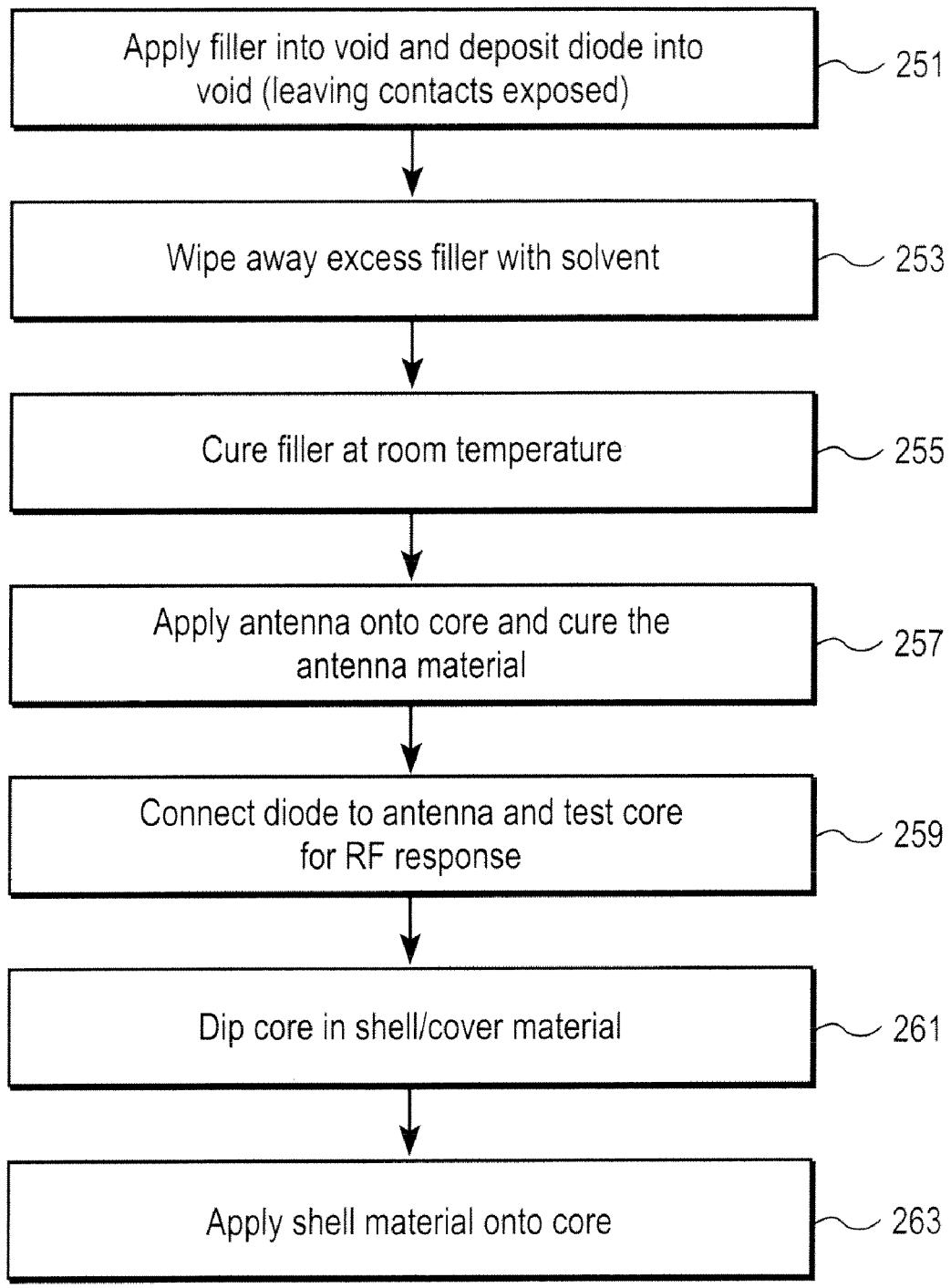
FIG. 9A is a flowchart which shows another exemplary method for manufacturing a golf ball.

The method of FIG. 9A may begin in operation 251 in which a filler material is applied into a void which has been formed on a portion of a golf ball during a golf ball manufacturing process. One or more voids may be formed on the portion and the filler is applied into each of those voids. A diode or other electrical component, such as an RFID IC, may be deposited into the void. The contacts on the electrical component may be left exposed or may be covered with the filler material and then wiped clean as in operation 253. In certain embodiments, the solvent which is used to wipe away excess filler may be water, which does not affect or dissolve the elastic conductive antenna material of at least certain embodiments described herein. The filler material is then cured at room temperature in operation 255. The antenna material is then applied onto the core and then cured in operation 257. Then the diode or other electrical component which has been deposited into the void is connected to the antenna, and the core is tested for an RF response in operation 259. The testing of the core, at this point, for an RF response allows the manufacturer to determine whether the core will function before the shell material is applied. This will save shell material, which should not be applied to defective cores, because they failed the RF response test. Further, the core may be saved if it fails the RF response test by tuning the tag (e.g. by trimming or adding ink to the shape of the antenna or its connections). Cores which pass the test will then be prepared for the application of a shell material by dipping or spraying the core in a shell or cover material or a material which is compatible with the shell or cover material. Operation 261 is similar to operation 213 in FIG. 8. Then the shell material is applied onto the core in operation 263. The application in operation 263 may involve an injection molding process.

Figure 9B:
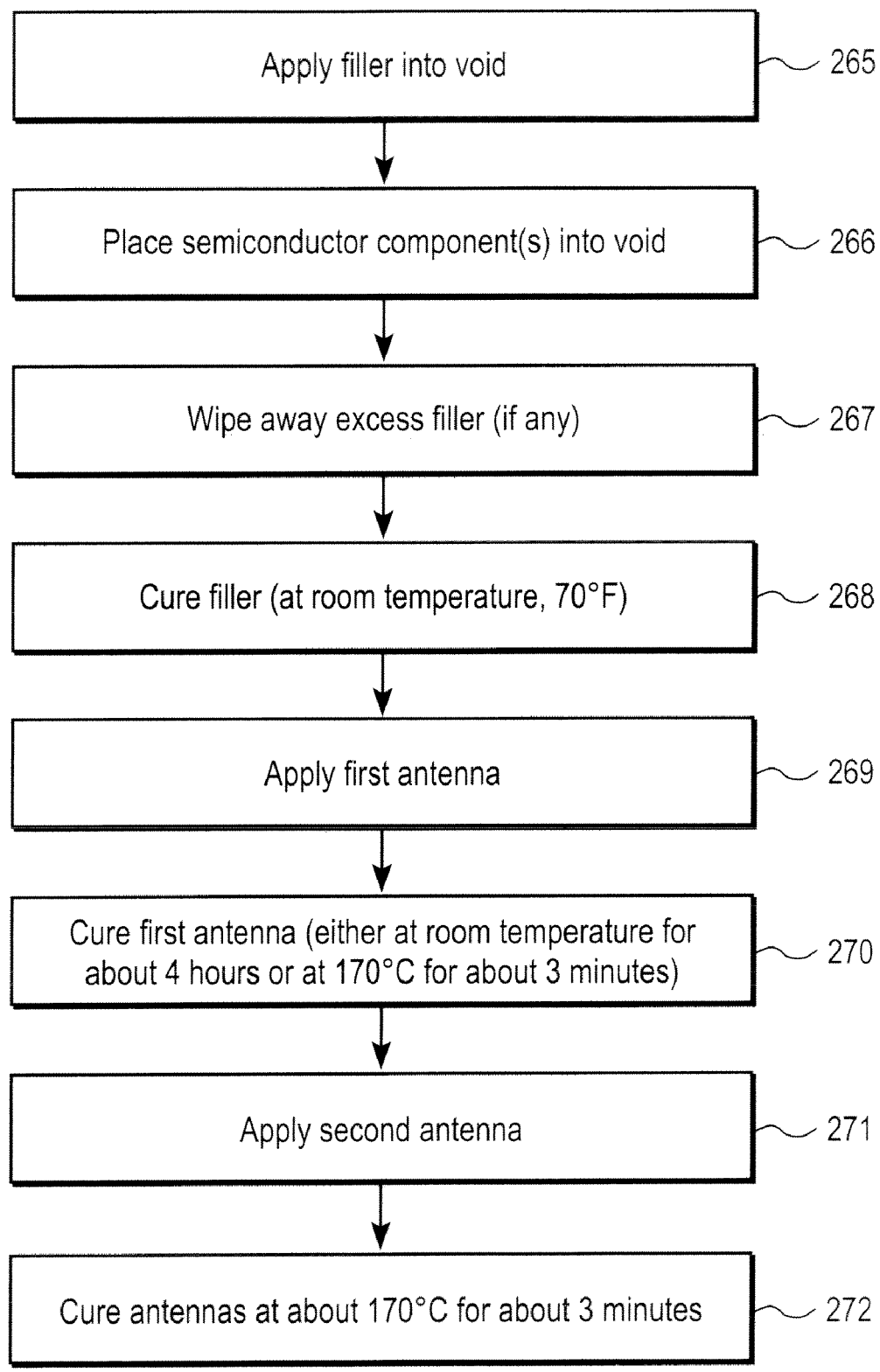
FIG. 9B is another flowchart which shows another exemplary method for manufacturing a golf ball.

FIG. 9B shows another exemplary method of manufacturing a golf ball. This method may begin in operation 265 in which a filler material is applied into one or more voids on a portion of the golf ball, such as a golf ball core. In operation 266, a semiconductor component (e.g. a diode or RFID IC) is placed into the void; the semiconductor component may be pressed into the void to insure that it contacts the bottom surface of the void. Any excess filler material is wiped away in operation 267, including any filler material on the electrical contact surfaces (e.g. bonding pads) of the semiconductor component. The filler material is then cured (at room temperature, about 70° F.) for about 120 minutes in operation 268. The curing time may range from about 40 minutes to over about 200 minutes. In operation 269, a first antenna is applied to the portion of the golf ball, and this first antenna is cured, in operation 270, either at room temperature for about 4 hours or at 170° C. for about three minutes. Then in operation 271, a second antenna is applied to the portion of the golf ball, and both antennas, in operation 272, are cured at about 170° C. for about three minutes.

Figure 10:
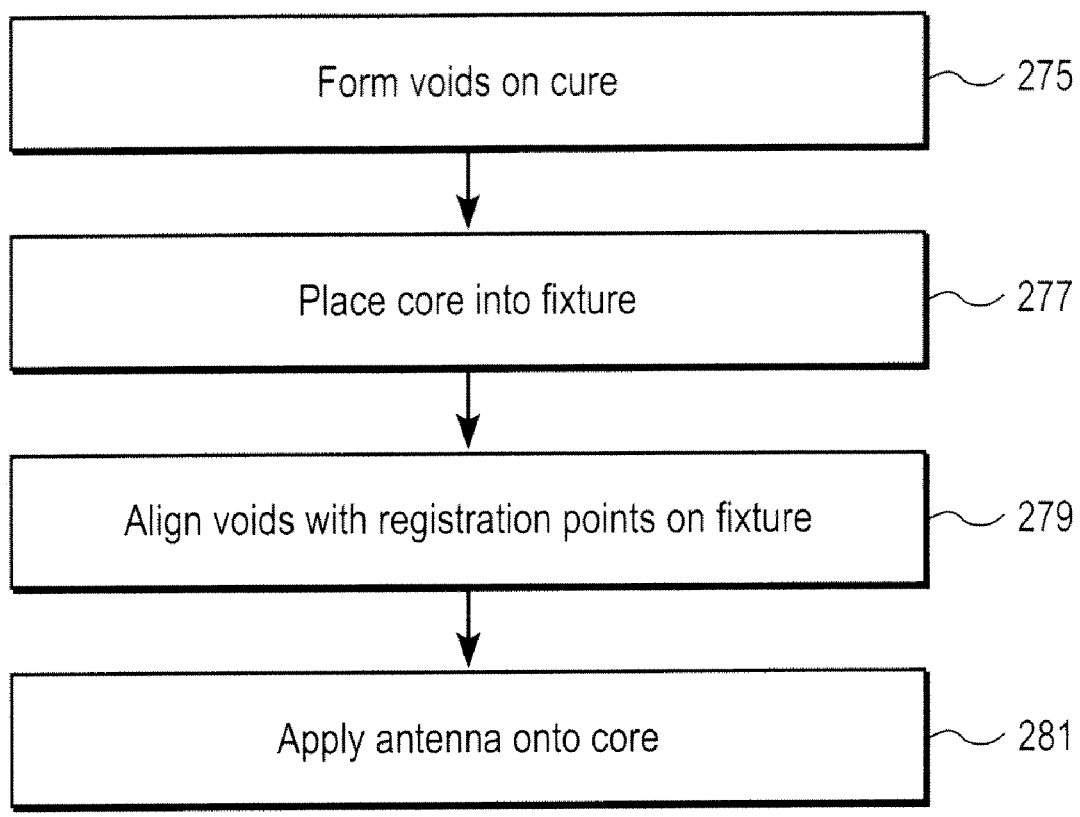
FIG. 10 is a flowchart which shows an exemplary method for aligning voids within a fixture for making portions of golf balls.
Figure 15:
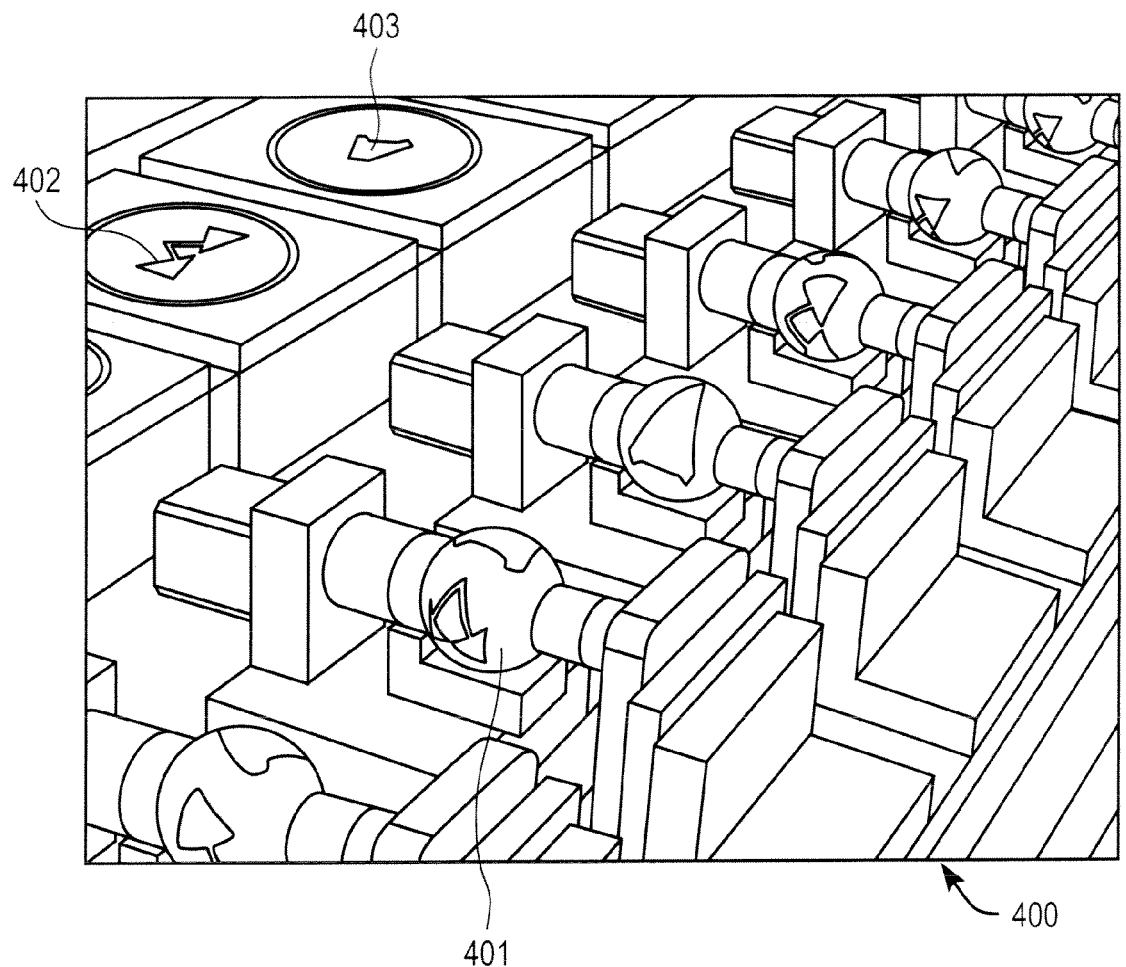
FIG. 15 shows a machine for fabricating several golf ball cores in an assembly line manner.

Aspects relating to the use of fixtures in manufacturing processes and the printing of segments of an antenna will now be described. FIG. 10 illustrates an exemplary method for aligning a portion of a golf ball within a fixture. This alignment may allow for the printing of multiple separate segments of an antenna onto the portion of a golf ball. The alignment of the portion of the golf ball within the jig or fixture which holds the golf ball portion makes it possible to have an assembly line manufacturing process in which several golf balls are moved along the assembly line and processed at various positions along this assembly line. The method of FIG. 10 may begin in operation 275 in which voids are formed on a portion of a golf ball, such as a core or mantle of the golf ball. The voids may be formed, for example, using the molds shown in FIG. 22. After the voids have been formed into the cores, the cores are placed into a fixture in operation 277. Examples of such fixtures are shown in FIG. 15 and in FIG. 21A. In operation 279, the voids are aligned with registration points on the fixture. This operation may be performed in a variety of different ways.

The core holding fixture acts as the position reference and is the transfer medium between a loader and all the pad printers.

One method for loading the cores involves a core loader system which consists of a camera with a fixed position relative to the fixture and a monitor displaying the location of the void on the core that is held by the fixture. A plastic transparent sheet is fitted over the monitor screen with an ink mark on the desired position. The void must match up with the mark for the printers to print the antenna correctly.

To set up the position mark on the plastic, a core is randomly loaded onto the fixture. The center portion of the antenna is printed on the core without the void. The fixture, with the core having the printed center portion of the antenna, is transferred to the loading station. The monitor display now shows the antenna and desired void position. An ink spot is placed where that void position is shown on the plastic sheet.

An alternate method is to use a laser beam to mark the spot while the core is being loaded to a fixture. The clamps on the fixture are kept open to allow the operator to rotate the core as needed to position the void to the spot where the laser beam is pointed.

To set up the laser beam position, a core is randomly placed onto the fixture. The center portion of the antenna is printed on the core without the void. The fixture, with the core having the printed center portion of the antenna, is moved under the laser beam. The laser beam is adjusted to position the beam over the proper position on the core.

Alternatively, a machine vision system is taught where the proper void position is using a similar method of first printing the antenna, then learning the void location. The machine is finally taught to recognize a void and to rotate the fixture to align the void.

In the example of the method shown in FIG. 10, the antenna is applied to the core in operation 281 after the core has been aligned within the fixture by operation 279. The antenna may be applied by a pad printing operation or by alternative operations, such as, for example, ink jetting operations or screen printing or sputtering, etc.

Placing the core into a fixture in a precise aligned position allows for the, presentation of the core to a pad printing machine which has multiple stations for printing several different segments of an antenna. Such a machine is shown in FIG. 15 and also in FIGS. 16A, 16B, and 16C.

Figure 13A:
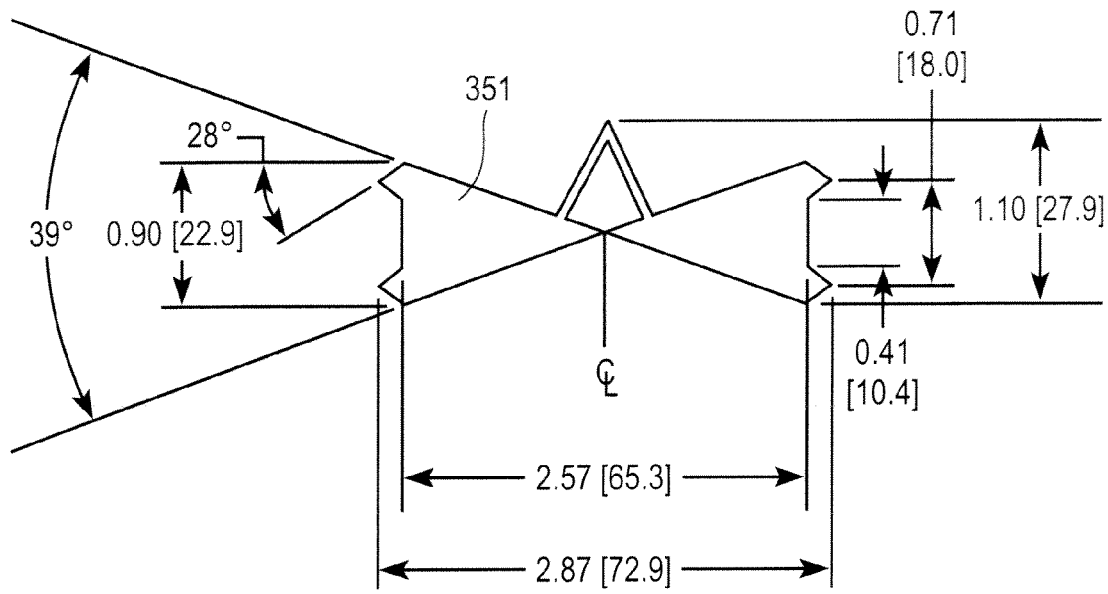
FIGS. 13A and 13B show dimensions of one exemplary embodiment of an antenna. The linear dimensions are in inches and millimeters (with millimeters being in brackets).
Figure 13B:
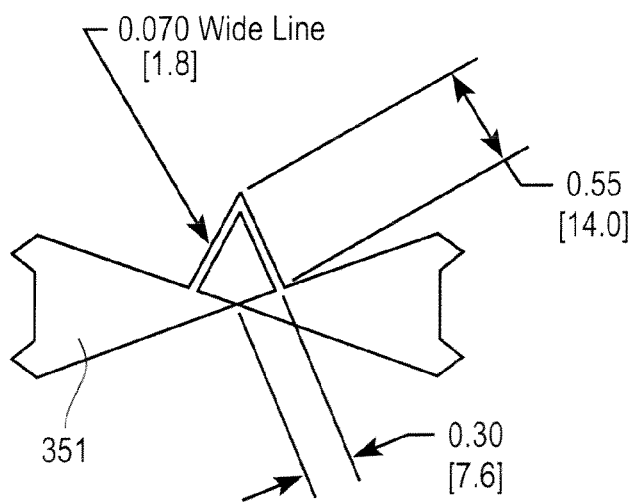
Figure 14A:
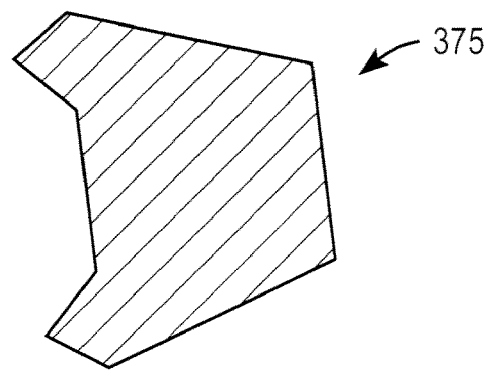
FIG. 14A shows a pattern for a first segment of an antenna, such as the antenna of FIG. 13A.
Figure 14B:
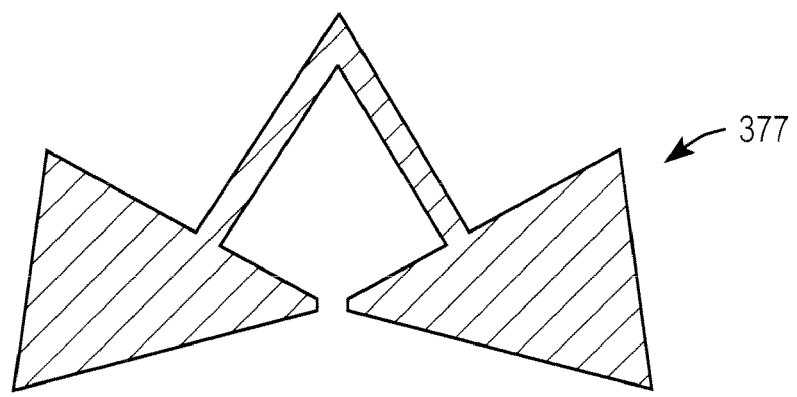
FIG. 14B shows a pattern for a second segment of the antenna of FIG. 13A.
Figure 14C:
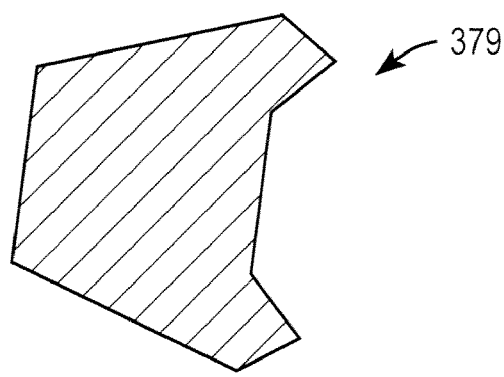
FIG. 14C shows a pattern for a third segment of the antenna of FIG. 13A.

FIG. 11 shows a method, according to one exemplary embodiment, for printing, in separate operations, several different segments of an antenna. The result over time of this printing of different segments is shown in FIGS. 12A, 12B, and 12C. FIGS. 12A, 12B and 12C represent a surface, such as the surface of a core or mantle of a golf ball, which receives the antenna material as a result of printing or otherwise applying the antenna material onto the surface over time, according to the method of FIG. 11. In operation 301 of FIG. 11, a first segment of an antenna is printed or otherwise applied onto a surface of a portion of a golf ball, such as the outer surface of the core of a golf ball. Optionally, the first segment may be printed repeatedly, such as four times, to achieve a certain amount of material which is applied onto the portion of the golf ball. It has been determined that the thickness of the ink and placement of multiple shapes directly affects signal strength (e.g. how much return signal is received from the ball's tag at a certain distance), and thus multiple layers of ink may be desirable to achieve the desired amount of conductivity. Various numbers of ink layers, such as conductive elastic ink used as the antenna material, may give different conductivities and may be implemented to fine tune designs for various frequency ranges and core compositions. After printing or otherwise applying the first segment in operation 301, the core is rotated within a fixture to present the core to the next printing station to print the next antenna segment in operation 303. Then in operation 305, the next segment, in this case the second segment of the antenna, is applied by, in at least certain embodiments, a pad printing operation. Optionally, this printing may involve repeatedly printing the second segment at least, for example, four times. The result of operation 301 produces the antenna segment 325 shown in FIG. 12A, while the result of operation 305 produces a combination of the first and second antenna segments, shown as combined antenna segments 327 shown in FIG. 12B. Then in operation 307, the core is again rotated within its fixture to print the next antenna segment, which occurs in operation 309 in which the third segment of the antenna is printed or otherwise applied. Optionally, this third segment may be repeatedly printed or applied, such as applied or printed four times. The result of the final printing of the third segment produces a final antenna 329 shown in FIG. 12C. It will be appreciated that an antenna may be printed in two segments rather than three, or it may be printed in four or more segments. It will also be appreciated that the segments may partially or significantly overlap to ensure sufficient conductivity between segments. It will also be appreciated that certain segments may be printed more times than other segments; for example, the middle segment (the second segment of operation 305) may be printed more times (e.g. six times) than the two outer segments, which are the first and third segments of FIG. 11. It will also be appreciated that the core may remain stationary and a robotic pad printing arm may move relative to the core to apply the different antenna segments onto the core. It will also be appreciated that the method of FIG. 11 may be utilized for more than one antenna on a particular golf ball. For example, two antennas using the method of FIG. 11 may be applied to the same golf ball core to achieve the orthogonal arranged set of antennas as shown in FIG. 6A. An example of a specific exemplary antenna, with its corresponding dimensions in inches (with millimeters shown in brackets), is shown in FIGS. 13A and 13B. The corresponding antenna segments are formed in a cliche, which resembles an inkwell, and are shown in FIGS. 14A, 14B, and 14C. Thus the three segments 375, 377, and 379 of FIGS. 14A, 14B, and 14C form the antenna pattern 351 shown in FIGS. 13A and 13B after completing three different printing operations as shown in FIG. 11. An exemplary machine for holding the printing pads and ink wells and the cores of the golf balls within fixtures along an assembly line is shown in FIG. 15. A machine 400 includes an assembly line of cores, such as core 401, held by an assembly line of fixtures as shown in FIG. 15. Several different inkwells, such as inkwells 402 and 403, hold the elastic conductive antenna material which is applied to printing pads which act as a transfer medium which transfer the antenna ink from the inkwells onto the cores. This is further illustrated in FIGS. 16A, 16B, and 16C.

Figure 16A:
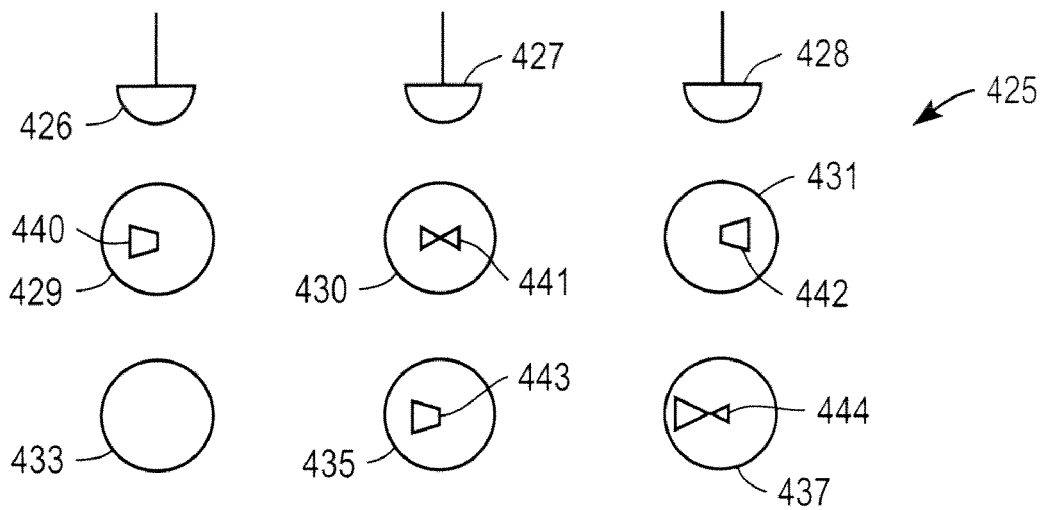
FIG. 16A shows a simplified view of the machine of FIG. 15.
Figure 16B:
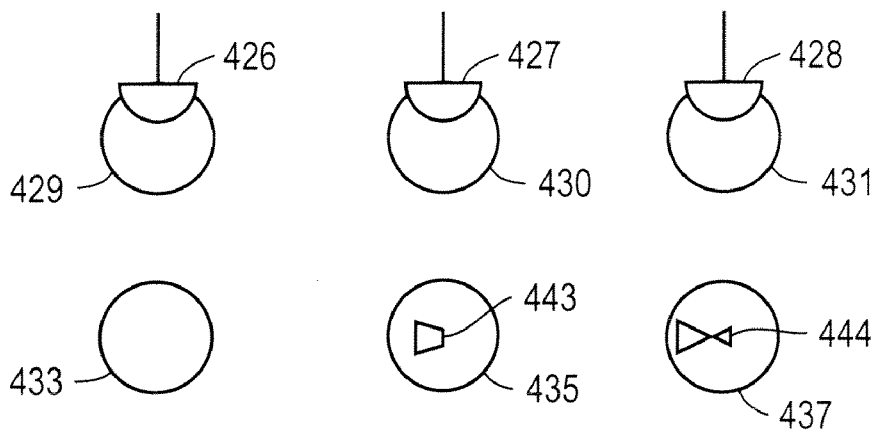
FIG. 16B shows a simplified view of the machine of FIG. 15 as the pads of the machine are receiving antenna material, in one of three different patterns, and before the pads apply the antenna material onto each of the golf ball cores.
Figure 16C:
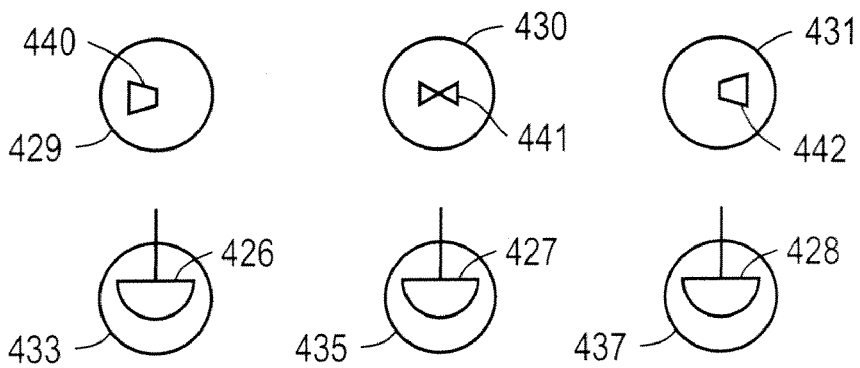
FIG. 16C shows a simplified view of the machine of FIG. 15 as the pads of the machine are depositing antenna material onto each of the golf ball cores.

The machine 425 shown in FIG. 16A includes three transfer (e.g. printing) pads 426, 427, and 428 which are designed to transfer elastic conductive antenna material from the printing wells onto the outer surface of the cores. Each pad is designed to transfer a specific segment of the antenna from its corresponding ink reservoir. The pads 426, 427, and 428 are automatically controlled to move between the clichés or inkwells 429, 430, and 431, respectively, onto balls positioned in fixtures, such as the balls 433, 435, and 437. It will be appreciated that the balls 433, 435, and 437 are, in at least one embodiment, a portion of the ball, such as a core of a ball or a mantle of a three (or more) piece golf ball. The ball 433 has no antenna segment printed on it yet while the ball 435 has the first segment 443 printed on it, which printing occurred when the ball 435 was in the station which is currently occupied by ball 433 shown in FIG. 16A. Similarly, the ball 437 includes an antenna which has both the first and second segment but not the third segment yet. The ink wells or reservoirs 429, 430, and 431 each include the three different segments, the first segment 440, the second segment 441, and the third segment 442. FIG. 16B shows that the pads 426, 427, and 428 have been brought into contact with their corresponding inkwell or clichéto receive the ink, which is the elastic conductive antenna material used in at least certain embodiments of the present invention, from the corresponding inkwells 429, 430, and 431. The pads 426, 427, and 428 are moved by robotic arms or other mechanisms from the position shown in FIG. 16B to the position shown in FIG. 16C in which the pads are now brought into contact with the corresponding balls 433, 435, and 437 as shown in FIG. 16C. Thus, FIG. 16C shows the simultaneous printing of several different segments on several different golf ball cores (or other portions). Various pad printing apparatuses, which are known in the art, may be modified for use with the apparatuses and methods described herein; examples of such known pad printing apparatuses are described in U.S. Pat. Nos. 6,276,266 and 6,840,167.

Figure 17:
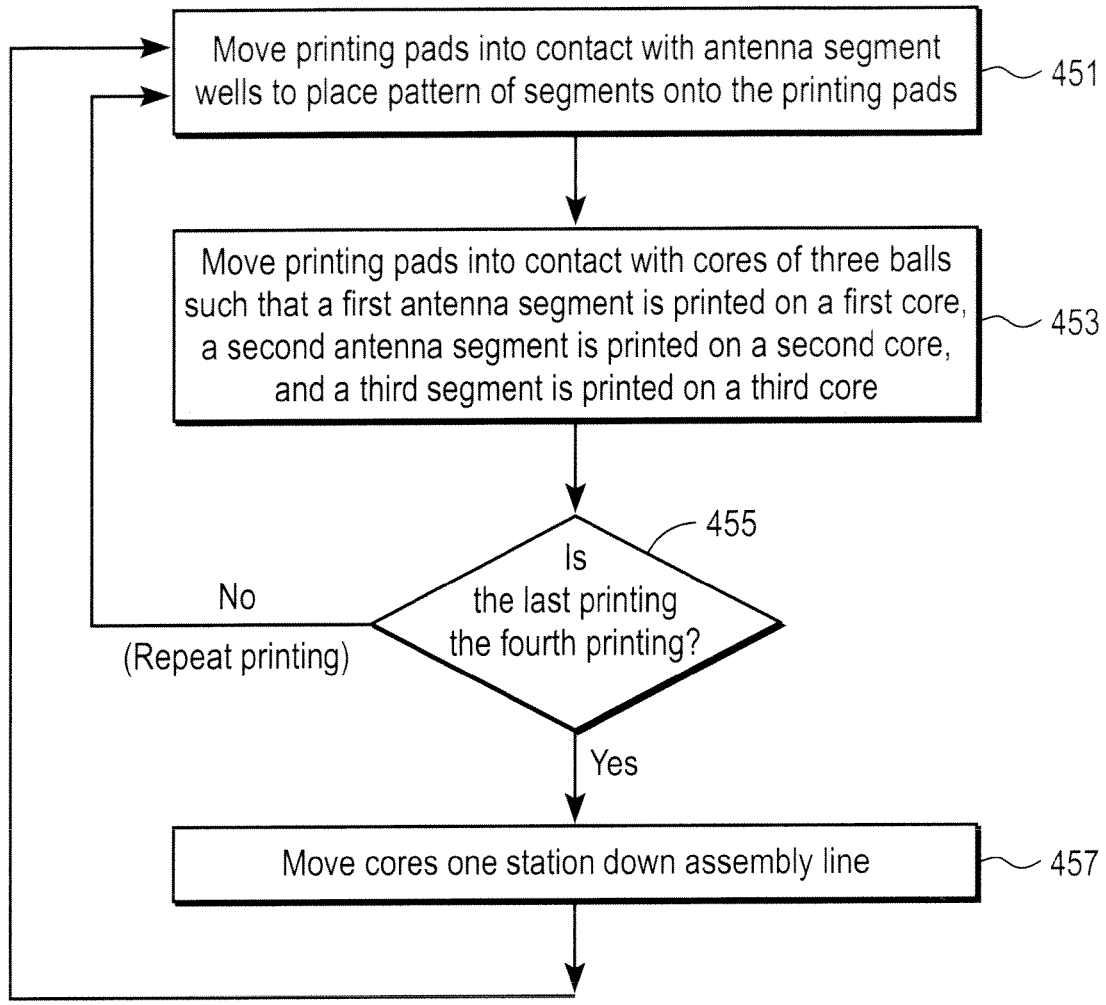
FIG. 17 is a flowchart which shows an exemplary method of manufacturing a group of golf balls.

FIG. 17 shows an exemplary method of using the apparatus shown in FIGS. 16A, 16B, and 16C. In operation 451 of FIG. 17, the printing pads are moved into contact with the antenna segment ink wells, such as the wells 429, 430, and 431. This places the antenna material for the segments onto the corresponding printing pads. Then the printing pads are moved into contact with the cores of three balls along the assembly line such that a first antenna segment is printed onto a first core, a second antenna segment is printed onto a second core, and a third segment is printed onto a third core. Then in operation 455, it is determined whether the last printing in operation 453 was the fourth printing for each of the cores. If it was not, the process then repeats by going back to operation 451 in which the pads are moved back into contact with the inkwells to receive further ink from the inkwells and then the pads are moved into contact again with the balls to print the same segment again. If it is determined in operation 455 that the last printing was the fourth printing, then processing moves to operation 457 in which the cores are moved one station down the assembly line. This can also be seen from the movie included with this application which depicts the operation of the machine shown in FIG. 15. The shapes of the segments in the antenna ink wells, such as wells 429, 430, and 431, are predistorted to account for the core's curvature. A composite of the printed shape meets the dimensional requirement of the design, such as the dimensional requirements shown in FIGS. 13A and 13B.

The presentation of the core by a fixture or jig affects the accuracy of printing the shaped components. A fixture or jig, which supports printing operations, is designed to rotate and hold the core or other portion of the ball. Two shafts, one on each side of the core, hold the core with significant force to prevent the core from rotating when pressed by the printing pad. The horizontal support portion of the fixture is shown as horizontal support 501 in FIG. 19A. FIG. 19B shows another side view of this portion of the fixture. The horizontal support includes a frame 502 which is coupled to shafts 503 and 504. These two shafts 503 and 504 hold the core with significant force which may be applied by a spring, such as a 100-pound spring or similar method. The spring 507 pushes the shaft 503 into the core 510 which is held by plates 505 and 506 at the respective ends of the shafts 503 and 504. The shafts may have a flat or slightly curved plate which faces the core or may include pins or other gripping features, such as the pins 477, 478, and 479 on the shaft 476 shown in FIG. 18. The shaft 504 may be fitted with a rotating mechanism which locks the rotation of the shaft 504 at a plurality of different points, which may be separated by 90° or by other angles. The shaft 504 in this implementation controls the rotation of the core. A vertical support, such as support 525, includes a platform 526 and a core support base 527 as shown in FIG. 20. The core support base 527 is designed to securely support the core in the vertical direction and is designed to fit through a hole in the bottom of the frame 502. The platform 526 is designed to attach to a moving assembly line, such as the assembly line shown in FIG. 15 or a stationary print station. The support 525 forms the vertical support portion of the fixture shown in FIG. 21A. The complete fixture shown in FIG. 21A holds the core 510 at four areas (areas 1, 2, 3 and 4). The core support base 527 counteracts the force 530 applied by the printing pads when these pads are applying antenna material onto the core. The horizontal support portion, which includes the frame 502, floats vertically above the platform 526 as shown in FIG. 21A. The gap between the bottom of the frame 502 and the top of the platform 526 allows the frame 502 to move freely in a vertical direction (e.g. the frame 502 may move down slightly when a printing pad applies antenna material onto the core in the fixture). This relieves the pressure on the horizontal shafts (503 and 504) and prevents the cores from moving relative to the shaft plates (505 and 506). This movement (of the cores relative to the shaft plates) can contribute to printing errors. Multiple printings of each segment may occur before the core is rotated in the jig or fixture. The loading of the cores can be visually guided or totally automatic using reference figures or other methods, such as those described herein. A visual method can be implemented with a video display using a camera acquired image of each core.

Figure 22:
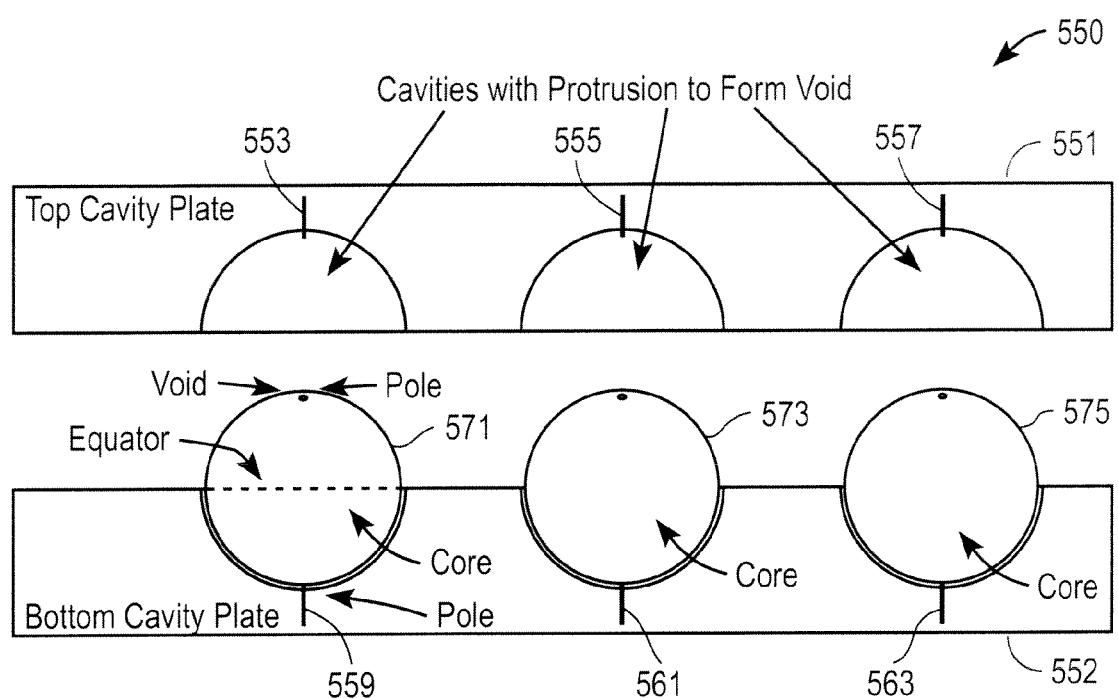
FIG. 22 shows, in a cross-sectional view, an example of a mold for forming golf ball cores.
Figure 23A:
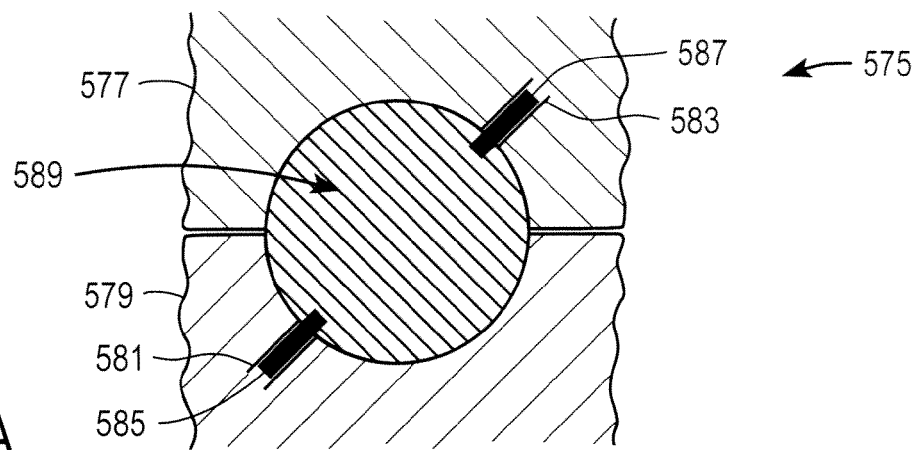
FIGS. 23A, 23B, and 23C show, in a cross-sectional view, another example of a mold for forming golf ball cores.
Figure 23B:
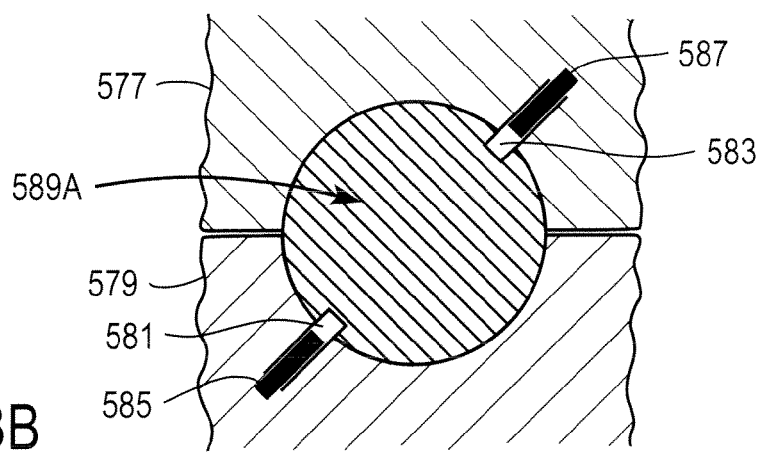
Figure 23C:
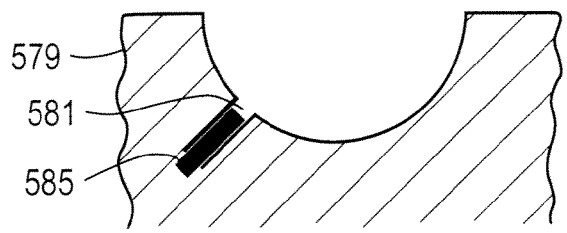

FIGS. 22, 23A, 23B, and 23C, and 24A and 24B show aspects of the invention relating to various molds for forming portions of golf balls. These molds are designed to form voids which are used to receive an electrical component into the void as described herein. The precursors to the cores are placed within the cavities of the mold. In the case of FIG. 22, protrusions at the poles of each mold form voids at the poles of each core. In particular, the protrusions 553, 555, 557, 559, 561, and 563 will form corresponding voids at the poles of the cores 571, 573, and 575. The top cavity plate 551 and the bottom cavity plate 552 together form the mold 550 for three cores. A specific rubber compound, which is the precursor to the core, is placed within the cavity and then the upper and lower cavity plates are closed horizontally and the molding process is performed to create the cores. Having these protrusions at the poles allows the cavity plates to be removed after the molding process is performed. If the protrusions were along the equator, the cavity plates could not be separated from the molded cores. FIGS. 23A, 23B, and 23C show an alternative molding process in which extendable and retractable protrusions from the sides of the cavity are used to form voids in the core. It will be appreciated that if these protrusions are not retractable, then the core would remain stuck within the cavity and could not be removed without damaging the core or the protrusions. Because the protrusions 585 and 587 are retractable, and are extendable, they can be extended to form the voids and then retracted after the molding process is completed to allow the molded core to be removed. The mold 575 includes an upper portion 577 and a lower portion 579. Each of those portions includes an extendable and retractable protrusion which is disposed within a channel which ends at an opening into the cavity which forms the core of the ball. The protrusions 585 and 587 are shown in FIG. 23A as extending into the cavity and therefore into the material which is being molded to form a core. This material may be considered a precursor material 589 which turns into the molded core 589a as shown in FIG. 23B which now includes voids created by the protrusions 585 and 587. The protrusions, after the formation of the void, may be retracted within the channels 581 and 583 to allow the removal of the formed core 589a. FIG. 23C shows the bottom portion 579 with the protrusion 585 which has been retracted within the channel 581.

Figure 24A:
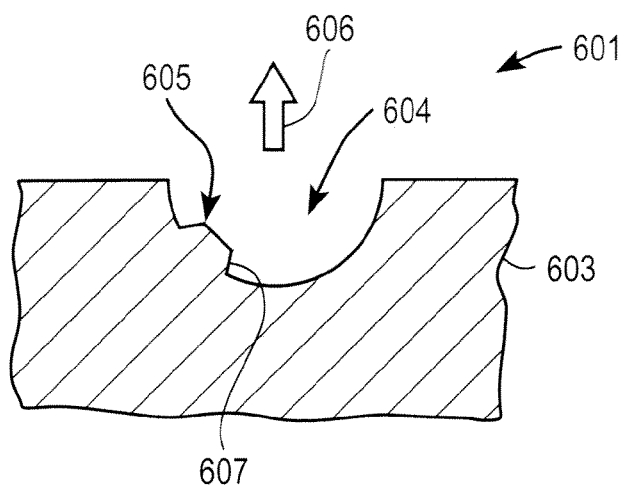
FIG. 24A shows, in a cross-sectional view, another example of a mold for forming a golf ball core.
Figure 24B:
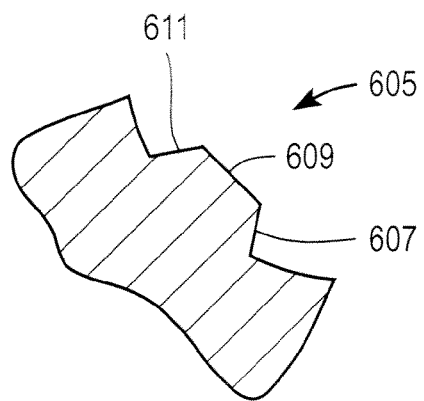
FIG. 24B shows an enlarged portion of the mold shown in FIG. 24A.

FIGS. 24A and 24B show an alternative mold which includes a fixed feature, rather than a retractable and extendable protrusional feature, which is designed to create a void within a portion of a golf ball. The mold 601 includes a cavity 604 designed to form the core or portion and a feature 605 which includes a wall 607 which is substantially parallel with the direction of removal 606 of a formed core or portion of a golf ball. Because the wall 607 is parallel with the direction 606, it will be possible to remove the formed core from the mold. If the wall 607 were parallel with wall 611 as shown in the enlarged view of the feature 605 shown in FIG. 24B, then it may not be possible to remove the formed core from the mold. It can be seen that the feature 605 includes a bottom portion or wall 609 and a wall 607 and a wall 611. The wall 607 does not form a perpendicular angle relative to the bottom wall or portion 609 and is not parallel with the other wall 611.

Figure 25:
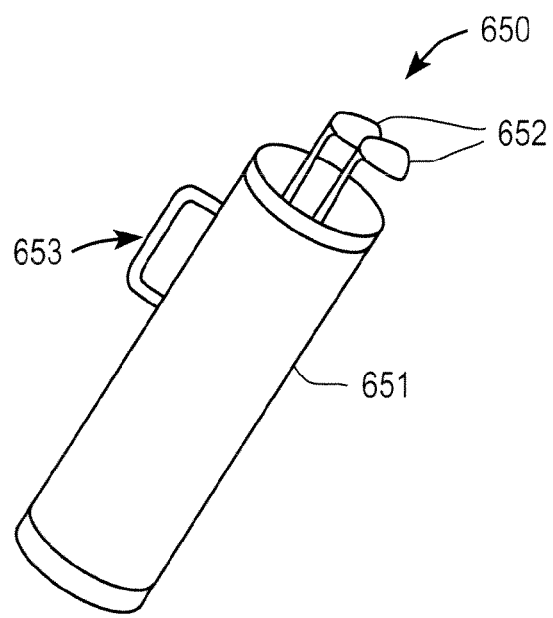
FIG. 25 shows an example of a golf club bag which includes a bag or pouch for holding golf balls and/or other objects and for shielding items within the bag or pouch from RF emissions.
Figure 26A:
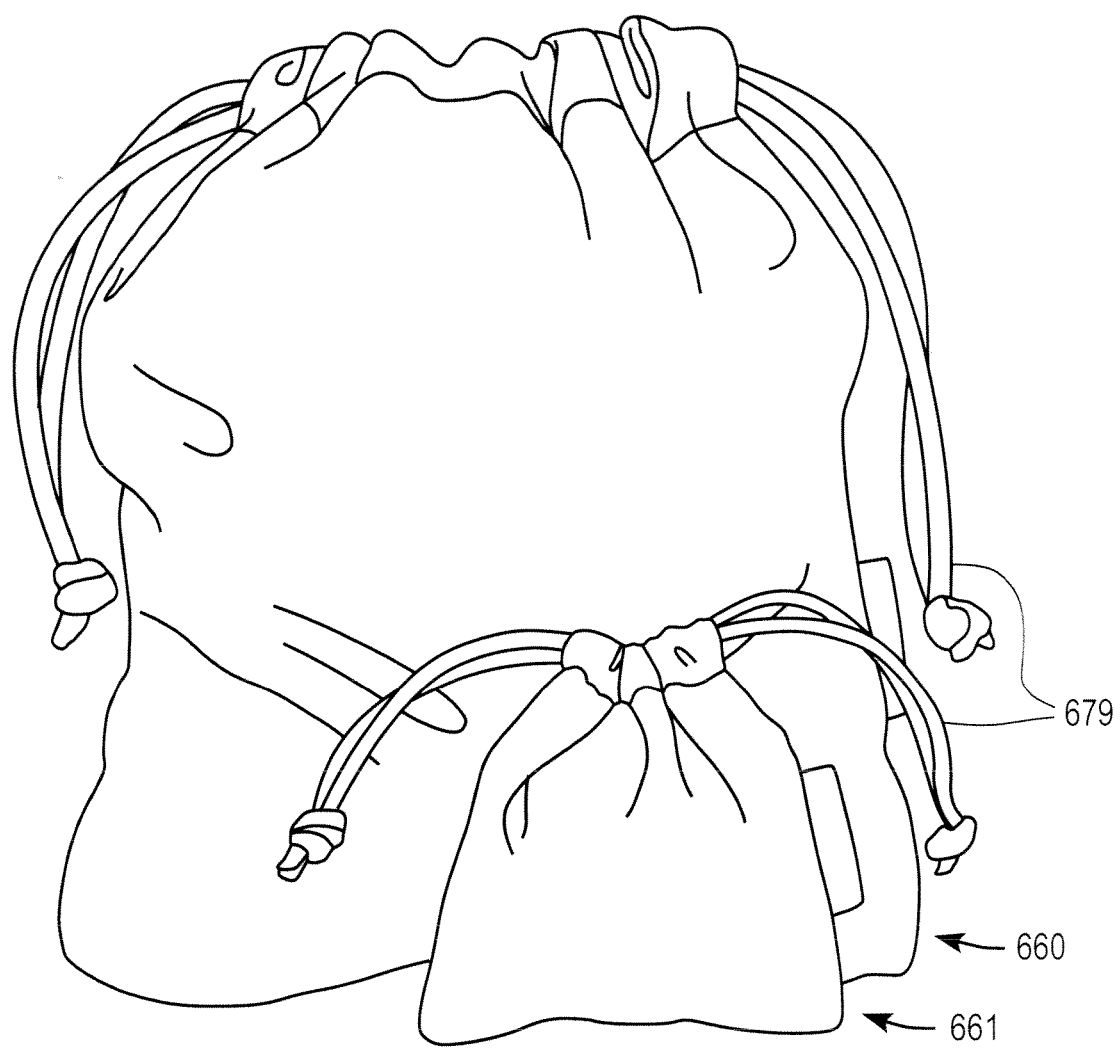
FIGS. 26A, 26B, and 26C show examples of containers, such as a bag, for holding golf balls and/or other objects and for shielding items within the container from RF emissions.
Figure 26B:
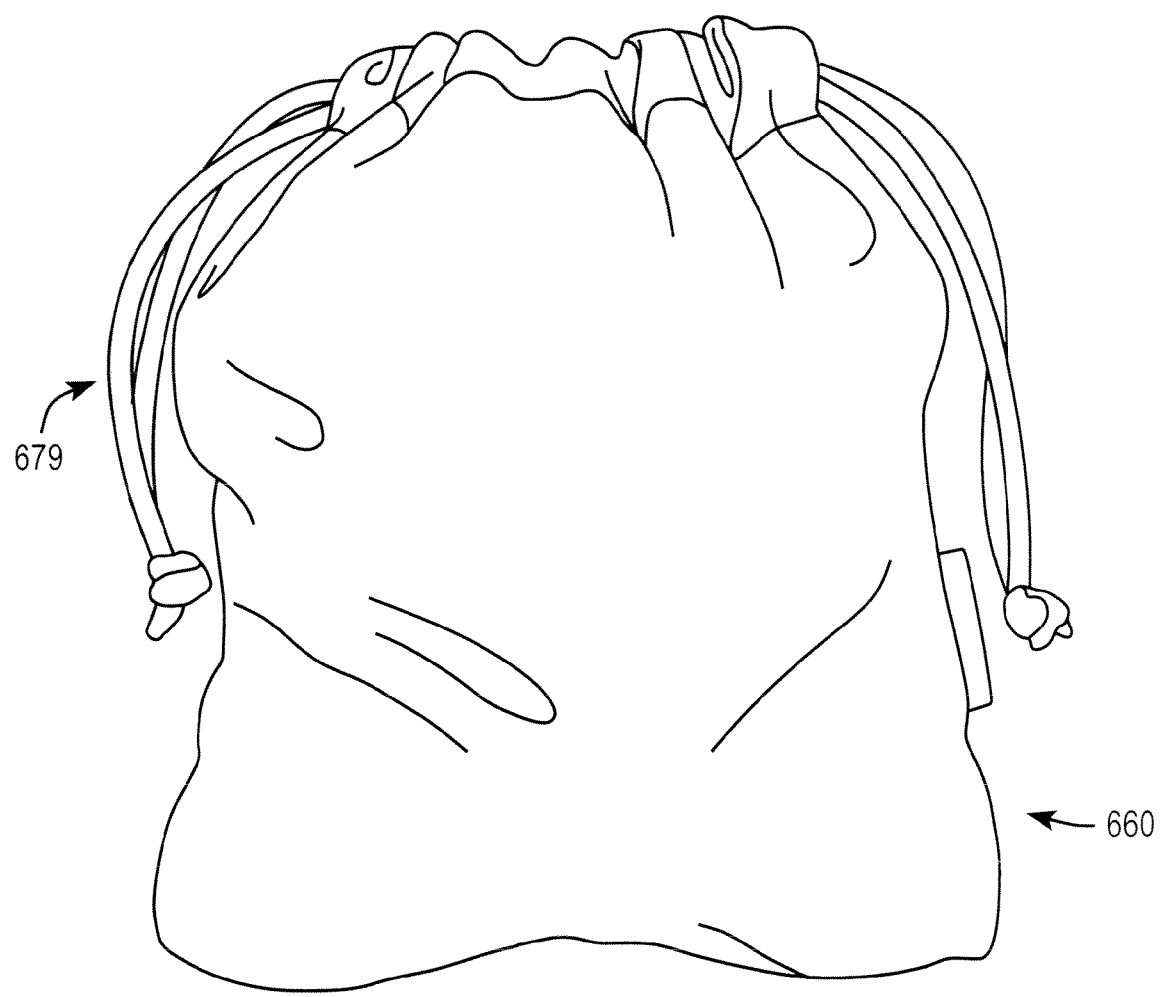
Figure 26C:

Another aspect of the invention relates to containers for shielding golf balls containing RF tags and also for shielding other objects, such as car keys and cellular telephones. These containers may be pouches or bags which may be part of golfing equipment, such as a golf club carrier 650 or a separate bag, such as the bags 660 and 661 shown in FIG. 26A. As shown in FIG. 25, an RF shielding bag 653 is attached to a golf club carrier or bag 651 which includes golf clubs 652. The container, such as the container 653, typically includes RF shielding material which is designed to attenuate significantly radio frequency emissions from a handheld transmitter/receiver unit, such as the transmitter/receiver unit 14 of FIG. 1A, and to also significantly attenuate any RF response from the contents (e.g. a golf ball) within the container. The container typically includes a closure which is coupled to the RF shielding material. The pouches or bags shown in FIG. 26A also include RF shielding material which significantly attenuates RF emissions from a handheld unit, and also significantly attenuates any RF response from the contents (e.g. a golf ball) within the container. The RF shielding material may be a lining (e.g. interior lining) attached to a fabric which is on the exterior of the bag. The closure 679 may be a drawstring or other mechanism (e.g. zipper) which allows the pouch or bag to be closed. A golfer may use these containers by placing one or more golf balls with radio frequency circuits and/or cellular telephones and/or car keys in the container, and after securing the objects within the container (e.g. by pulling the drawstring tight to seal the opening of the bag), then activating the handheld radio frequency transmitter, such as the handheld unit 14, in order to locate other balls not in the pouch. The pouch or container will significantly attenuate the RF emissions from the handheld and prevent false signals from being detected by the handheld which would have been caused by the golf balls in the pouch or container if they were not shielded by the RF shielding material of the container. The RF shielding material typically attenuates the RF emissions by at least 70% and even more in certain embodiments. The two bags 660 and 661 are shown side by side in FIG. 26A to show their relative sizes. The larger bag 660 may hold many golf balls and other objects (e.g. it may hold over one dozen golf balls within the RF shielding material of bag 660), and the smaller bag 661 holds no more than 2 or 3 golf balls and is designed to fit within a pants pocket of a golfer. In a preferred embodiment, the bag 661 holds no more than 1 golf ball and has an interior volume of less than about 6 to 10 cubic inches. In alternative embodiments, the interior volume of bag 661 may be as large as about 12 to 15 cubic inches. The bag 660 is shown by itself in FIG. 26B, and FIG. 26C shows bag 661 without bag 660.

Another aspect of the inventions involves the coating of cores which include circuitry (such as an RF tag or an RFID IC and an antenna) before applying further layers (such as a shell material) onto the cores. It is desirable to fabricate a portion of a golf ball, such as a completed core (which includes a semiconductor component coupled to an antenna), and then store and/or ship the completed core for an extended period of time (e.g. more than two weeks) before finishing the fabrication of the golf ball by, for example, applying a shell material onto the completed core. This would allow the completed cores to be formed in one location and shipped to and stored at another location and then, potentially several weeks later, the golf balls are finished by applying the shell material and performing the remainder of the manufacturing operations at the another location. This practice was not possible in the past because a completed core without a coating will degrade in performance after about two weeks; in other words, the shelf life of a core, such as a solid core, is no more than about two weeks after molding for a premium quality golf ball. Beyond the two week period after molding, the core loses its resilience (sometimes referred to as coefficient of restitution) by as much as 1 foot per second in initial velocity, as measured by commonly used test equipment. Further, the conductive ink used to make antennas, in at least certain embodiments, will oxidize if there is no coating.

A coating may be applied to cores by dipping or spraying the cores with a material which seals the core and any electronic components, such as an antenna and/or semiconductor component, on the core. The material should exhibit and promote good core-to-cover adhesion properties to maintain the performance properties of a golf ball and should be capable of being applied with either a standard spray gun or in a dipping process. The material which forms the coating normally acts as a sealant to preserve the resiliency and "freshness" of the core and to prevent the oxidation of the antenna or the contacts between the antenna and circuitry. The material may be any one of: (1) a solvent (e.g. alcohol) based clear finishing material; (2) a water-based clear finishing material; (3) a water-based white pigmented base coat material; or (4) an ionomeric dispersion such as Surlyn (e.g. from Dupont) material. After the coating is formed, the core may be stored and/or shipped and used when desired. The coated cores may, for example, be shipped to a customer who desires to finish the golf balls using their own manufacturing facilities with their own shell material and their own dimple design for the shell. This method of coating a core and then delaying the completion of the golf ball may also be used on conventional golf ball cores which do not include RF circuitry or antennas, etc. In addition to the coating of cores, or as an alternative to the coating, the cores, with attached antennas and circuitry, may be stored under vacuum after being formed. The sealing of cores in a vacuum in bags or other containers may be an acceptable substitute for coating with a sealant material or may be done in addition to the coating.

Other aspects of the inventions described herein relate to automation of the golf ball manufacturing process. This automation may include automatically aligning the voids on the cores to receive filler and/or semiconductor components, automatically dispensing filler material into the voids on the cores, automatically picking and placing components onto the cores (e.g. automatically picking and placing a semiconductor component into a void on a core), automatically screen printing an antenna on a core, and automatically inserting a semiconductor component into a void and printing the entire shape of an antenna and its connection to the semiconductor component (without requiring any touch-up, by hand, in which the antenna shape is completed to the component). These various aspects will be discussed while referring to FIGS. 27A, 27B and 27C.

Figure 27A:
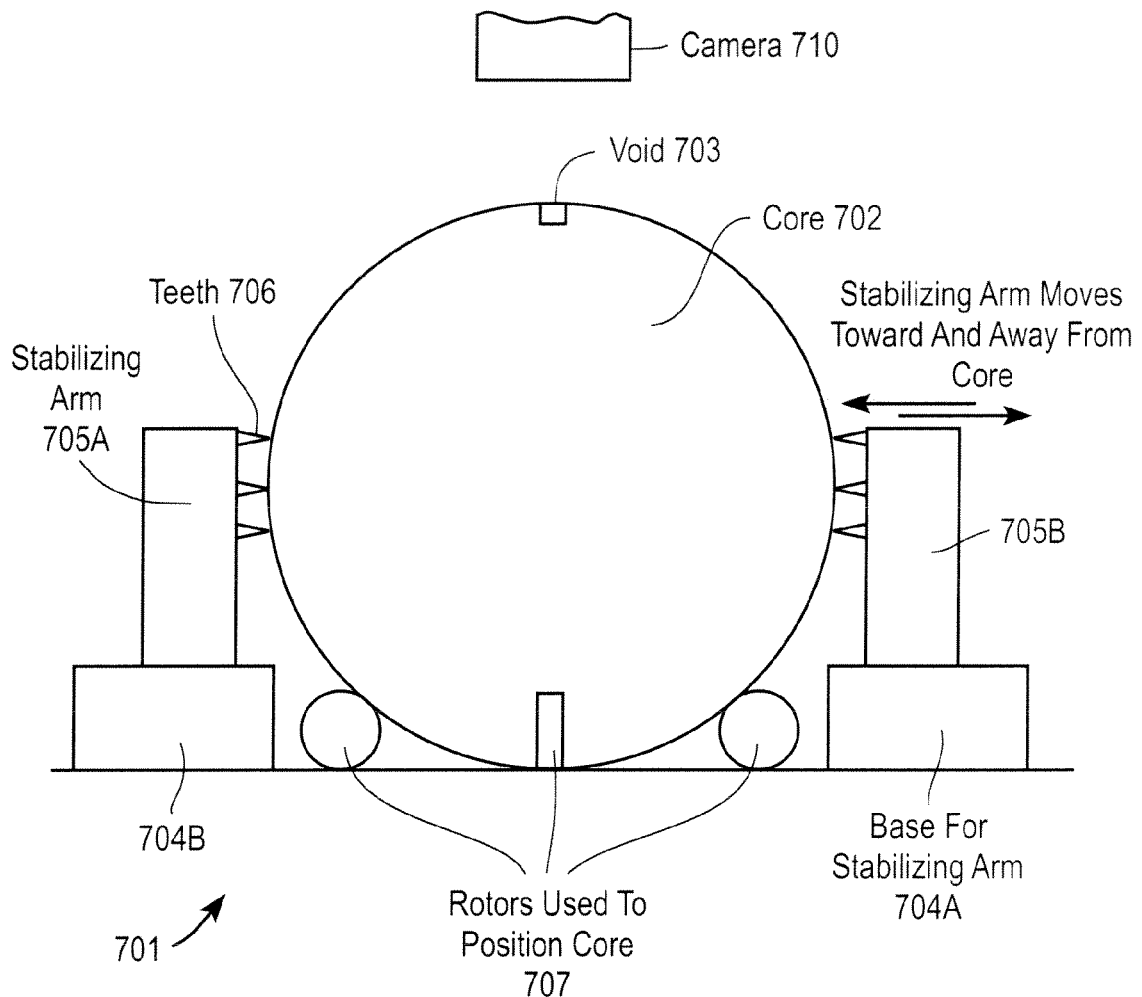
FIG. 27A shows an example of a fixture for automatically aligning voids on a ball core.

FIG. 27A shows a side view of a fixture 701 which receives and holds a core, such as a golf ball core 702, which includes a void 703 for receiving a semiconductor component (e.g. a diode or RFID IC). The fixture may include three or more rotors, such as rotors 707, which rotate the core. Normally, the rotation of the core is used to align the void relative to the fixture so that the semiconductor component can be placed into the void and the filler material can be dispensed into the void and an antenna material can be applied onto the core surrounding the void and connecting to the bonding pad(s) on the semiconductor component. The fixture may include multiple instances of the apparatus shown in FIG. 27A, each of which holds a core and each of which moves from one station (e.g. a station for aligning a void relative to a fixture) to another station (e.g. a station for dispensing a filler material into the voids of the cores and/or a station picking and placing a semiconductor component into each void) to another station (e.g. a station for applying the antenna material, such as an elastic conductive material onto a core). Thus, the fixture may hold multiple cores which are processed in batch operations. Each fixture includes at least two (and preferably 3 or more) bases 704 (e.g. bases 704A and 704B) which are attached to a main frame (shown in FIGS. 27B and 27C) and which are attached to stabilizing arms 705A and 705B. The stabilizing arms can move toward the core to secure the core and hold it or move away from the core to allow it to be released. Teeth 706 on arms 705A and 705B grasp the core to hold it stable during the manufacturing operations. The fixture may be used to position the core under camera 710, which captures images of the core; a conventional image recognition system may be used to identify the void and to determine and track its position on the core in the images captured by the camera 710. The rotors 707 may be used to spin the core 702 so that the location of the void, relative to the fixture, is at a predetermined location (e.g. the predetermined location of the void may be pointing at the azimuth as shown in FIG. 27A). The camera 710 and the conventional image recognition system are used to determine the current position of the void and to determine the movements of the rotors 707 in order to bring the void to the predetermined location. After the core 702 has been positioned in this manner, processing may proceed to the next operations, such as automatically dispensing a filler material into the void and automatically, through a robotic arm, picking and placing a semiconductor component into the void and automatically applying an antenna material onto the core and connected to the semiconductor component. At least in certain embodiments, all of these operations may be performed while the core remains in the same fixture and moves from station to station as noted above.

Figure 27B:
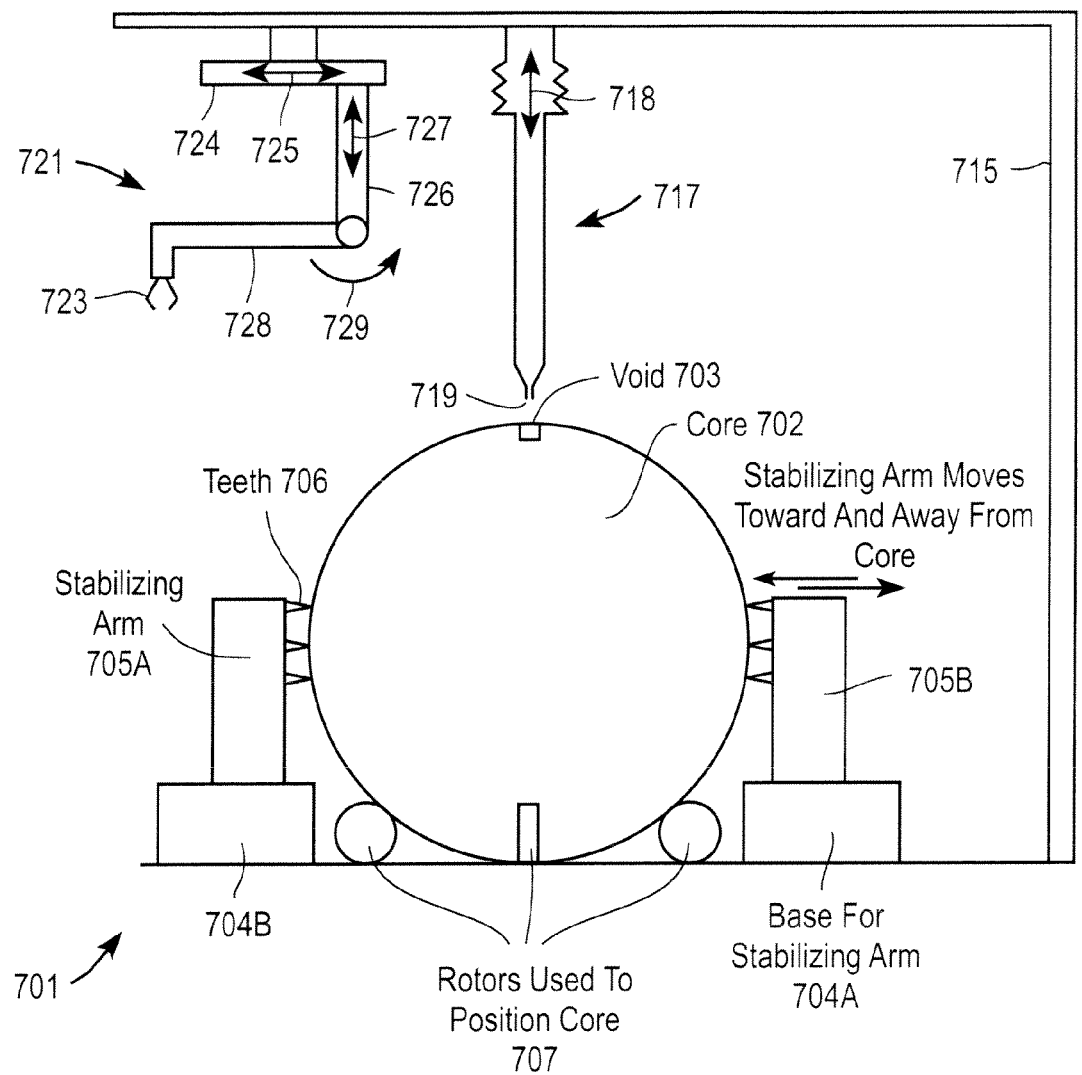
FIG. 27B shows an example of a fixture for automatically dispensing filler material and robotically picking and placing components into a void on a ball core.

FIG. 27B shows a side view of a fixture 701 in a filler dispensing and pick and place station. In certain embodiments, there may be multiple cores, each held in a fixture, within this station so that these multiple cores may be processed in a batch operation in which each core receives filler material and a semiconductor component, and there may be multiple dispensers and robotic arms within this station. The fixture 701 is attached to a frame 715 which supports both the fixture 701 and dispenser 717 and robotic arm 721; the frame 715 also serves to provide a frame of reference so that the position of the void 703 is precisely determined relative to the dispenser 717 and the robotic arm 721. The dispenser 717 has a known position relative to the location of fixture 701 and the void 703, when the fixture 701 is positioned in registration with frame 715, such that the dispenser 717 can be lowered into a position to dispense filler material, through nozzle 719, into the void 703. In certain embodiments, the dispenser 717 is brought into physical contact with the void or a portion of the core which surrounds the void in order to dispense the filler material, and a pressure sensor, attached to the dispenser, determines when contact is made; this may be desirable in order to accommodate cores which have different sizes. The dispenser 717 can dispense either a precise amount of filler material or an amount which will leave an excess which is wiped away. The dispenser 717 moves (e.g. through a bellows or a telescoping tube assembly) up and down as shown by arrow 718. The dispenser may be fixed in x and y on frame 715 and move only up and down. In alternative embodiments, the dispenser could be attached to an automated or robotic arm which moves from one position (over a first void) to another position (over a second void). At the same station, a robotic arm is used to automatically (without human intervention) pick a semiconductor component (e.g. grasp a semiconductor component from a reel containing many such components) and move the component into position over the void and place the component into the void. In an alternative embodiment, the robotic arm may be at a different station. The robotic arm 721 includes a mechanical hand 723 coupled to pivoting arm 728, a gantry stage 724 (which allows for x and y movement relative to frame 715, such as x movement shown by arrow 725) coupled to telescoping arm 726. The robotic arm 721 is attached to frame 715. The telescoping arm 726 allows the hand 723 to move up and down (in z) by movement of telescoping arm 726 along arrow 727. The pivoting arm 728 allows rotation of the hand 723, as shown by arrow 729, around an axis of rotation defined by the telescoping arm 726, which is coupled to the pivoting arm by a rotational joint. The robotic arm 721 has a known position relative to the location of fixture 701 and the void 703, when the fixture 701 is positioned in registration with frame 715, such that the robotic arm 721 can automatically pick and place a semiconductor component into void 703. Normally, the cores, with their voids, are positioned relative to the arm 721 in a pre-aligned position such that the void 703 is at a known position relative to the hand 723 (e.g. the fixture 701 aligns the core as described in conjunction with FIG. 27A and the core retains this alignment within frame 715). In certain embodiments, the mechanical hand 723 may include a camera which captures images of a semiconductor component and the void and which provides those images to a conventional image recognition system which uses those images to determine the position of a component and/or a void relative to the hand 723 in order to control the movement of the hand 723 in the picking and placing operations. The hand 723 may also include a pressure sensor to sense it has made physical contact with the void or with a portion of the core surrounding the void. The hand 723 may be used to press the component into the void to assure that the component is properly seated within the void. In at least certain embodiments, the filler material is dispensed into the void before the component is placed into the void, although the reverse sequence may be used in certain embodiments.

Figure 27C:
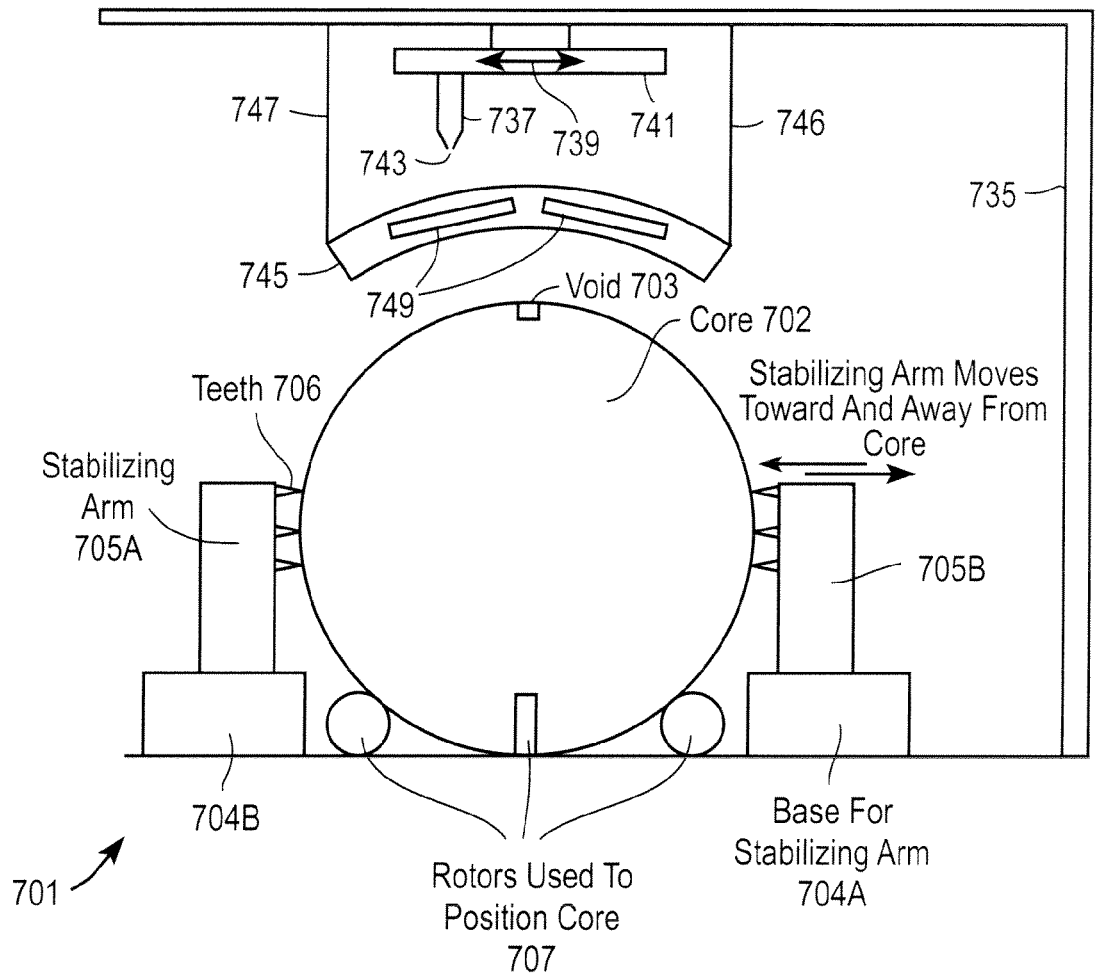
FIG. 27C shows an example of a fixture for automatically applying an antenna material, such as an elastic conductive ink, onto a ball core.

FIG. 27C shows a side view of a fixture 701 in an antenna applying station. This station includes a frame 735 which may be coupled to frame 715 in the filler dispensing station of FIG. 27B. The fixture 701 may ride on a track or belt which moves it from the filler dispensing station to the antenna applying station, and the fixture 701 may keep the core aligned relative to the fixture and the frames 715 and 735. Thus, upon entering frame 735, the fixture 701 is normally already aligned to the frame 735 such that the sprayer 737 and mask 745 can be automatically aligned to the void 703 and core 702; in alternative embodiments, the core 702 may be aligned again within frame 735 (and relative to sprayer 737 and mask 745) using a camera and a conventional image recognition system as described above. The station of FIG. 27C includes a mask 745 which is coupled to frame 735 by posts 747 and 746. A sprayer 737 is coupled to frame 735 through an x,y gantry stage 741 which allows the sprayer 737, and its outlet nozzle 743, to be moved in x (shown by arrow 739) and y while applying the antenna material, through outlet nozzle 743 and through the mask 745, onto the core 702 to create a shaped antenna on the core. The mask 745 includes two openings 749 which are shaped to provide the proper shape for an antenna which is sprayed onto the core 702. The mask 745 may be a custom semi-spherical screen that covers enough of one core to print one antenna (or a portion thereof) at a time. The mask 745 may be positioned above the core or in contact, or very close proximity, with the core. If the mask covers a significant portion of the core, it may be necessary to position the mask so that parts of fixture 701 (e.g. stabilizing arms 705A and 705B) do not interfere with the mask or the application of antenna material through the mask. In the case of the system shown in FIG. 27C, the position of the mask may be rotated 90° from that shown in FIG. 27C to allow the use of a larger mask. The posts 747 and 746 may have telescoping parts to allow the mask to be raised and lowered relative to the core. The sprayer 737 may be a fine tip, computer controlled air sprayer. In another embodiment, the antenna material may be applied by a rubber blade through a silk screen. In one embodiment, the antenna material may be applied onto the core in a desired shape and also be applied onto the electrical contact surfaces of the semiconductor component in one operation without requiring a hand touch-up of the connection between the antenna and the semiconductor component.

It will be appreciated that numerous modifications of the various embodiments described herein may be made. For example, each golf ball could be printed with a unique identification number such as a serial number in order to allow a user to identify from a group of lost balls which lost ball is his/her lost ball. Alternatively, a quasi-unique identifier, such as a manufacturing date when the ball is manufactured, may be printed on the outside of the ball so it can be read by a user to verify that a user's ball has been found within a group of lost balls which have been uncovered by the handheld transmitting/receiving device. Alternatively, the user may apply an identifier such as the user's initials onto the ball to thereby identify the ball when it has been uncovered by a handheld transmitting/receiving device. It will also be appreciated that the tags discussed above are passive tags having no active integrated circuit components such as semiconductor memory circuits, and the antenna does not need to energize such active integrated circuit components such as semiconductor memory components. However, in certain alternative embodiments, tags, such as RFID integrated circuit (IC) tags which include an electronic identification number (IDN) stored within the IC, may be used in the various different findable golf balls described herein. These tags would be "read" by a transmitting/receiving (T/R) device which transmits the IDN and "listens" for a reply from the tag with the IDN or which transmits a request for the IDN and listens for the IDN. In this case a user would program the IDN of a golf ball into the T/R device which can then be used to find the ball. The entire circuitry of such an RFID IC (within an IC) may be fit into 1 package (e.g. one of the packages shown in FIGS. 7A-7C) and coupled to an antenna. Such an RFID (with IDN) may be used in a ball without a longer range tag (such as a harmonic tag which may be implemented as shown in FIGS. 2A, 2B, and 3A) in the same ball, or such an RFID (with IDN) may be used in a ball with a longer range tag (e.g. as implemented in FIGS. 2A, 2B and 3A) in the same ball as the RFID (with IDN).

It will be understood that the terms "core" and "core material" are used, at least in the claims, in a broader sense than just a golf ball core per se (e.g. the innermost element of the ball), and hence these terms include a mantle layer which surrounds another golf ball material such as an innermost core or another mantle layer. Thus, a semiconductor component may be disposed in a void of a mantle layer and attached to antenna portions on the surface of the mantle layer and be surrounded by a filler material within the void in the mantle layer, which in turn is surrounded by another mantle layer. The various aspects of the embodiments described herein are not limited to two-piece balls but are applicable to balls having three or more pieces. Further, even the shell may be formed from more than one piece; for example, a shell may be made by prefabricating two or more sides of the cover or shell material. The core, with an antenna and a semiconductor component, is attached to both prefabricated pieces to finish the golf ball. It will also be understood that the terms "shell" or "shell material" are normally used to refer to the outermost exterior material on the golf ball.

While various embodiments described herein relate to golf balls, alternative embodiments may be used in other types of balls (e.g. baseballs).

The various embodiments of golf balls described herein may work with a handheld transmitting/receiving device which transmits electromagnetic energy at a first frequency and receives re-radiated energy at a second frequency. Examples of such transmitting/receiving devices are described in co-pending U.S. application Ser. No. 10/346,919, filed on Jan. 17, 2003 by inventors Chris Savarese, et al., which application is hereby incorporated herein by reference at least for the purpose of describing such transmitting/receiving devices.

In the foregoing specification, the invention has been described with reference to specific examples. It will be evident that various modifications may be made thereto without departing from the broader spirit and scope specified by the following claims. The specification and drawings are, accordingly, to be regarded in an illustrative sense rather than a restrictive sense.

What is claimed is:

1. A portion of a golf ball, the portion comprising:
  a core material having a void;
  a semiconductor component disposed at least partially in the void;
  a filler material in the void and surrounding the semiconductor component, the filler material being capable of transforming from a liquid state having a first volume into a solid state which occupies substantially the first volume within the void and wherein the filler material and the core material are different materials;
  at least one elastic conductive antenna attached to the core material and coupled to the semiconductor component, and wherein the semiconductor component is one of a diode or transistor or a Radio Frequency Identification integrated circuit and wherein the at least one elastic conductive antenna is configured to transmit an RF signal through the air.

2. A portion of a golf ball as in claim 1 wherein a difference in volume between the liquid state and the solid state is less than about 0.2% of the liquid state.

3. A portion as in claim 1 wherein the filler material cures without evaporating a solvent.

4. A portion as in claim 1 wherein the filler material cures by a chemical reaction between components in the filler material, and wherein the filler material and the semiconductor component occupy substantially all space in the void, and wherein the filler material changes from the liquid state to the solid state without any significant shrinkage or expansion.

5. A portion as in claim 1 further comprising:
  a sealant encases the elastic conductive antenna and the semiconductor component; and
  a shell material which encapsulates the sealant and wherein the void is on an outer surface of the core material.

6. A golf ball comprising:
  a golf ball material having a void at a surface of the golf ball material;
  an antenna disposed on the surface of the golf ball material, the antenna being configured to transmit a Radio Frequency signal through the air;
  a semiconductor component disposed at least partially in the void;
  a filler material in the void and surrounding the semiconductor component on at least two sides of the semiconductor component and wherein the surface of the golf ball material defines an upper edge of the void which is substantially planar with an upper surface of the filler material and an upper edge of the semiconductor component and wherein the filler material and the golf ball material are different materials.

7. A golf ball as in claim 6 wherein the filler material surrounds the semiconductor component on four side surfaces and on a bottom surface of the semiconductor component.

8. A golf ball as in claim 7 wherein the antenna is an elastic conductive antenna attached to the golf ball material and coupled to the semiconductor component and further comprising a sealant which encases the semiconductor component and the elastic conductive antenna and wherein the filler material is applied into the void as a liquid.

9. A golf ball as in claim 7 wherein an upper surface of the filler material and the surface of the golf ball material provide a relatively smooth surface to support the antenna and wherein a precise amount of filler material is applied into the void.

10. A golf ball comprising:
  a golf ball material having a void at a surface of the golf ball material;
  a filler material disposed in the void;
  a semiconductor component disposed at least partially in the void, wherein an electrical connection surface of the semiconductor component faces the golf ball material at a side of the void and wherein the surface of the golf ball material defines an upper edge of the void which is substantially planar with an upper surface of the filler material and an upper edge of the semiconductor component.

11. A golf ball as in claim 10 further comprising:
  an antenna disposed on the surface of the golf ball material and at least partially on the side of the void and being coupled to the electrical connection surface.

12. A golf ball as in claim 11 wherein the side of the void is a bottom surface of the void.

13. A portion of a golf ball comprising:
  a core material having a void;
  an antenna coupled to the core material;
  a filler material disposed in the void;
  a semiconductor component coupled to the antenna;
  a sealant encasing the antenna and the semiconductor component and the core material, wherein the sealant is applied before applying a shell material, and wherein the sealant prevents the core material from being exposed to air and moisture before the shell material is applied and wherein the antenna comprises an elastic conductive material and wherein the semiconductor component is disposed in the void in a surface of the core material and wherein the filler material and the core material are different materials.

* * * * *